US 11,454,563 B2

(12) United States Patent
Marsh

(10) Patent No.: US 11,454,563 B2
(45) Date of Patent: Sep. 27, 2022

(54) MICRO PRESSURE SENSOR

(71) Applicant: Encite LLC, Burlington, MA (US)

(72) Inventor: Stephen Alan Marsh, Carlisle, MA (US)

(73) Assignee: Encite LLC, Burlington, MA (US)

(*) Notice: Subject to any disclaimer, the term of this patent is extended or adjusted under 35 U.S.C. 154(b) by 224 days.

(21) Appl. No.: 15/668,837

(22) Filed: Aug. 4, 2017

(65) Prior Publication Data
US 2018/0038754 A1 Feb. 8, 2018

Related U.S. Application Data

(60) Provisional application No. 62/371,361, filed on Aug. 5, 2016.

(51) Int. Cl.
G01L 9/00 (2006.01)
G01L 19/00 (2006.01)

(52) U.S. Cl.
CPC .......... *G01L 9/0073* (2013.01); *G01L 9/0072* (2013.01); *G01L 19/00* (2013.01)

(58) Field of Classification Search
CPC .... F04B 43/025; F04B 43/026; F04B 43/021; F04B 43/0045; F04B 43/043; G01L 9/0072; G01L 9/0073; G01L 9/0075
See application file for complete search history.

(56) References Cited

U.S. PATENT DOCUMENTS 2,195,792 A * 4/1940 Nils .................... F04B 43/0027
417/322

3,620,651 A * 11/1971 Hutton .................. B63H 11/06
417/436

(Continued)

FOREIGN PATENT DOCUMENTS

CN 101133309 2/2008
WO WO2016/069988 A 6/2016

OTHER PUBLICATIONS

International Search Report, PCT/US17/45449.

(Continued)

*Primary Examiner* — Tran M. Tran
(74) *Attorney, Agent, or Firm* — Fish & Richardson P.C.

(57) ABSTRACT

A micro pressure sensor includes a body having a compartmentalized chamber provided by membranes anchored between opposing walls of the body and carrying electrodes disposed on surfaces of the membranes. The body has a first pair of opposing walls and a second pair of opposing walls orthogonal to the first pair that define a chamber, a plurality of membranes having a correspond electrode layer over a surface, the plurality of membranes disposed in the chamber, anchored between the first pair of opposing walls of the body to provide plural compartments, a first set of ports coupled to a first set of the plural compartments, the first set of ports disposed in corresponding portions of a first one of the first pair of opposing walls of the body, with a second one of the first pair of opposing walls of the body being a solid portion of the body; and a second set of ports coupled to a second different set of the plural compartments, the second set of ports disposed in corresponding portions of the second one of the first pair of opposing walls of the body, with the first one of the first pair of walls of the body being a solid portion of the body.

19 Claims, 18 Drawing Sheets

(56) References Cited

U.S. PATENT DOCUMENTS

| | | | | |
|---|---|---|---|---|
| 3,642,385 A * | 2/1972 | McMahon | F04B 39/08 | 417/411 |
| 4,648,807 A * | 3/1987 | Tippetts | F04B 43/046 | 417/413.2 |
| 5,165,281 A * | 11/1992 | Bell | G01L 9/0075 | 361/283.4 |
| 5,338,164 A * | 8/1994 | Sutton | F04B 43/046 | 417/413.2 |
| 5,687,767 A | 11/1997 | Bowers | | |
| 5,836,750 A * | 11/1998 | Cabuz | A61M 5/14224 | 417/322 |
| 5,889,354 A * | 3/1999 | Sager | F04B 43/04 | 310/331 |
| 6,007,309 A * | 12/1999 | Hartley | F04B 43/043 | 417/322 |
| 6,042,345 A * | 3/2000 | Bishop | F04B 17/003 | 417/322 |
| 6,106,245 A * | 8/2000 | Cabuz | F04B 43/0063 | 417/322 |
| 6,179,586 B1 * | 1/2001 | Herb | F04B 43/043 | 417/322 |
| 6,184,607 B1 * | 2/2001 | Cabuz | H02N 1/006 | 310/309 |
| 6,247,908 B1 | 6/2001 | Shinohara | | |
| 6,261,066 B1 | 7/2001 | Linnemann | | |
| 6,406,605 B1 * | 6/2002 | Moles | F15C 5/00 | 137/833 |
| 6,443,154 B1 | 9/2002 | Jalde | | |
| 6,561,224 B1 * | 5/2003 | Cho | F15C 5/00 | 137/827 |
| 6,568,286 B1 * | 5/2003 | Cabuz | F04B 43/043 | 73/863.31 |
| 6,655,923 B1 * | 12/2003 | Lisec | B81C 1/00357 | 417/412 |
| 6,729,856 B2 * | 5/2004 | Cabuz | F04B 43/025 | 417/322 |
| 6,758,107 B2 * | 7/2004 | Cabuz | F04B 43/043 | 417/320 |
| 6,767,190 B2 * | 7/2004 | Cabuz | F04B 43/025 | 417/322 |
| 6,889,567 B2 * | 5/2005 | Cabuz | F04B 43/043 | 417/413.1 |
| 6,948,918 B2 * | 9/2005 | Hansen | A61M 5/14224 | 417/395 |
| 6,968,862 B2 * | 11/2005 | Cabuz | F15C 5/00 | 137/625.48 |
| 6,991,213 B2 * | 1/2006 | Wang | G01L 9/0072 | 251/129.01 |
| 7,008,193 B2 * | 3/2006 | Najafi | F04B 43/043 | 417/244 |
| 7,090,471 B2 * | 8/2006 | Xie | B81C 1/00119 | 137/607 |
| 7,216,048 B2 * | 5/2007 | Wang | G01L 9/0072 | 702/98 |
| 7,517,201 B2 * | 4/2009 | Cabuz | F04B 43/043 | 417/413.2 |
| 7,546,772 B2 * | 6/2009 | Cabuz | G01L 9/0055 | 361/283.1 |
| 7,802,970 B2 * | 9/2010 | Singhal | F04B 43/043 | 417/410.2 |
| 7,841,385 B2 * | 11/2010 | Campbell | H05K 7/20218 | 165/104.33 |
| 8,230,906 B2 * | 7/2012 | Campbell | H05K 7/20218 | 165/104.33 |
| 8,308,452 B2 * | 11/2012 | Amirouche | F04B 43/046 | 417/413.2 |
| 8,646,335 B2 * | 2/2014 | Kotovsky | G01L 1/18 | 438/51 |
| 8,828,320 B2 * | 9/2014 | Bardell | G01N 35/00603 | 422/68.1 |
| 8,841,820 B2 * | 9/2014 | Bennett | F04B 17/003 | 310/328 |
| 8,991,262 B2 * | 3/2015 | Nakatani | G01L 9/0073 | 257/415 |
| 9,029,212 B2 * | 5/2015 | Hong | B81B 3/0021 | 257/414 |
| 9,068,899 B2 * | 6/2015 | Wang | G01L 9/12 | |
| 9,206,030 B2 * | 12/2015 | Hong | G01L 9/0073 | |
| 9,217,426 B2 * | 12/2015 | Wackerle | F04B 43/04 | |
| 9,471,116 B2 * | 10/2016 | de Bock | G06F 1/20 | |
| 9,956,531 B2 * | 5/2018 | Dacey, Jr. | B01D 69/12 | |
| 9,976,923 B2 * | 5/2018 | Burgard | G01L 9/125 | |
| 10,006,824 B2 * | 6/2018 | Tsai | B81B 3/0021 | |
| 10,018,194 B2 * | 7/2018 | Harvey | F04B 43/043 | |
| 10,330,095 B2 * | 6/2019 | Marsh | F04B 43/043 | |
| 10,386,251 B2 * | 8/2019 | Klemm | G01L 1/2281 | |
| 10,451,501 B2 * | 10/2019 | Eilersen | G01G 21/245 | |
| 10,508,647 B2 * | 12/2019 | Stobbe | F04B 45/0536 | |
| 10,512,164 B2 * | 12/2019 | Marsh | H05K 1/189 | |
| 10,532,354 B2 * | 1/2020 | Wikswo | C12M 23/16 | |
| 10,718,323 B2 * | 7/2020 | Bennett, Jr. | F04B 43/025 | |
| 11,092,150 B2 * | 8/2021 | Marsh | F04B 43/0045 | |
| 2002/0029814 A1 | 3/2002 | Unger | | |
| 2003/0106799 A1 | 6/2003 | Covington et al. | | |
| 2003/0231967 A1 | 12/2003 | Najafi et al. | | |
| 2004/0103899 A1 | 6/2004 | Noble | | |
| 2004/0115068 A1 | 6/2004 | Hansen et al. | | |
| 2008/0218934 A1 | 9/2008 | Langereis | B01L 3/502707 | 361/283.1 |
| 2008/0280112 A1 * | 11/2008 | Langereis | B01L 3/502707 | 428/201 |
| 2009/0074595 A1 | 3/2009 | Chen et al. | | |
| 2009/0129952 A1 | 5/2009 | Patrascu et al. | | |
| 2009/0130607 A1 | 5/2009 | Slafer | | |
| 2010/0181871 A1 | 7/2010 | Daniel et al. | | |
| 2011/0207328 A1 | 8/2011 | Speakman | | |
| 2012/0138704 A1 * | 6/2012 | Saddoughi | H01L 41/0973 | 239/102.2 |
| 2013/0032210 A1 * | 2/2013 | Johnstone | F04B 19/006 | 137/1 |
| 2013/0046330 A1 | 4/2013 | Kabasawa et al. | | |
| 2013/0319125 A1 | 12/2013 | Wang et al. | | |
| 2013/0327149 A1 | 12/2013 | Nakatani | | |
| 2014/0147346 A1 | 5/2014 | Chitnis et al. | | |
| 2015/0008541 A1 | 1/2015 | Hong | | |
| 2015/0276533 A1 * | 10/2015 | Belov | G01R 33/07 | 324/251 |
| 2016/0131126 A1 * | 5/2016 | Marsh | F04B 43/043 | 156/153 |
| 2016/0169758 A1 | 6/2016 | Hooper et al. | | |
| 2016/0184495 A1 * | 6/2016 | Fouillet | A61M 1/962 | 417/474 |
| 2020/0084892 A1 * | 3/2020 | Marsh | B81C 1/0015 | |
| 2020/0087138 A1 * | 3/2020 | Schenk | H04R 7/06 | |
| 2020/0333171 A1 * | 10/2020 | Marsh | H05K 3/386 | |
| 2020/0400553 A1 * | 12/2020 | Manz | G01L 13/026 | |

OTHER PUBLICATIONS

European Search Report, PCT/US2017/045449, dated Feb. 24, 2020, p. 1-7.

Examination Report, Application No. 2019/17005682, dated May 12, 2021, p. 1-6.

http://www.murata-ps.com/emena/2012-05-22.html 2 pages.

Chinese Office Action, Appln No. 201780061568.6, dated Jul. 3, 2020, p. 1-27.

* cited by examiner

| Capacitance (pF) | | Separation | Pressure |
|---|---|---|---|
| one | Seven | $D_{air}$ (um) | Cm $H_2O$ |
| 0.38 | 2.68 | 50.00 | 0.00 |
| 0.42 | 2.97 | 45.00 | 0.02 |
| 0.47 | 3.32 | 40.00 | 0.18 |
| 0.54 | 3.77 | 35.00 | 0.62 |
| 0.62 | 4.36 | 30.00 | 1.47 |
| 0.74 | 5.17 | 25.00 | 2.86 |
| 0.91 | 6.34 | 20.00 | 4.95 |
| 1.17 | 8.21 | 15.00 | 7.86 |
| 1.66 | 11.63 | 10.00 | 11.73 |
| 2.85 | 19.93 | 5.00 | 16.70 |
| 9.96 | 69.73 | 0.00 | 22.91 |

FIG. 8

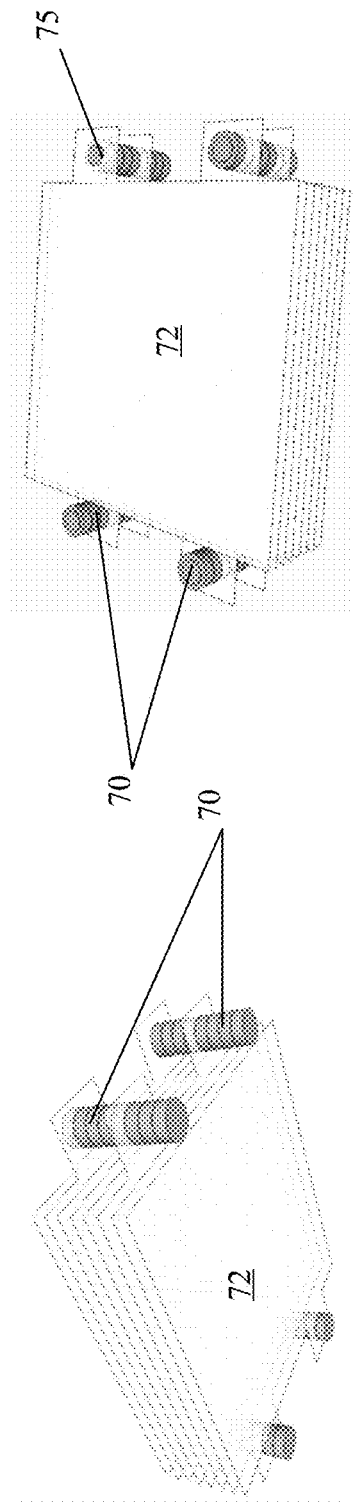

MICRO PRESSURE SENSOR

CLAIM OF PRIORITY

This application claims priority under 35 U.S.C. § 119(e) to provisional U.S. Patent Application 62/371,361, filed on Aug. 5, 2016, entitled: "Micro Pressure Sensor," the entire contents of which are hereby incorporated by reference.

BACKGROUND

This specification relates to pressure sensor devices and systems.

A pressure sensor detects or measures a pressure, i.e., a force that is exerted by a fluid, with the force being the force necessary to oppose the fluid from expanding. Typical pressure sensors generate an electrical signal as a function of the pressure imposed on the sensor. Pressure sensors are used in a variety of control and monitoring applications and can be used to indirectly measure other physical quantities such as fluid flow, fluid speed, and altitude.

Pressure sensors are fabricated using various techniques, each of which find use according to performance, application suitability and cost considerations. Of the types of pressure sensors one type of pressure sensor is a force collector type. A force collector type uses a force collector (such as diaphragm, piston, etc.) to measure strain (or deflection) resulting from a force applied to the force collector. Types of force collectors include a piezoresistive strain gauge type that uses the piezoresistive effect to detect strain due to applied pressure and a piezoelectric type that uses the piezoelectric effect found in certain materials such as quartz, certain ceramics and certain polymers.

Another type is a capacitive type that uses a diaphragm and pressure cavity to create a variable capacitor to detect strain due to applied pressure. Common technologies use metal, ceramic, and silicon diaphragms. Such sensors can be fabricated using silicon MEMS (microelectromechanical systems) techniques.

SUMMARY

According to an aspect, a micro pressure sensor includes a body having a pair of opposing walls that define a chamber, a plurality of membranes each having a correspond electrode layer over a surface thereof, the plurality of membranes disposed in the chamber and anchored between opposing walls of the body to provide plural compartments within the chamber, a first set of ports coupled to a first set of the plural compartments, the first set of ports disposed in corresponding portions of a first one of the pair of opposing walls of the body, with a second one of the pair of opposing walls of the body being a solid portion of the body, and a second set of ports coupled to a second different set of the plural compartments, the second set of ports disposed in corresponding portions of the second one of the pair of opposing walls of the body, with the first one of the pair of walls of the body being a solid portion of the body.

The above aspect may include one or more of the micro pressure sensor further including a pair of end caps connected to the body to confine the chamber. The micro pressure sensor has the first set of ports as inlets configured to be coupled to a fluid source at a source pressure and the second set of ports as outlets configured to be coupled to a reference pressure. The micro pressure sensor has a first set of the plural membranes electrically connected and a second set of the plural membranes electrically connected. The micro pressure sensor wherein each port of the first set of ports and each port in the second set of ports are staggered with respect to a preceding one of the respective first set of ports and second set of ports. The micro pressure sensor wherein the micro pressure sensor is coupled to a capacitance measurement circuit. The micro pressure sensor of wherein a controller converts measured capacitance into a pressure. The micro pressure sensor wherein the micro pressure sensor is configured to be driven by a fluid flow at a pressure, with the fluid directed into the first set of ports that are inlets causing the plural membranes disposed in the chamber to flex according to pressure differences between the fluid flow pressure and a reference pressure applied to the second set of ports that are outlets. The micro pressure sensor wherein a fluid flow at a pressure out of the first set of ports causes a first one of the plural compartments coupled to one of the first ports to compress, and causes at least one compartment adjacent the one of the plural compartments to expand substantially simultaneously for an under-pressure mode where the fluid flow pressure is less than a reference pressure. The micro pressure sensor of wherein a fluid flow at a pressure into the first set of ports causes a first one of the plural compartments coupled to the one of the first ports to expand, and causes at least one compartment adjacent one of the plural compartments to compress substantially simultaneously for an overpressure mode where the fluid flow pressure is greater than a reference pressure.

According to an additional aspect, a micro pressure sensor includes a first micro pressure sensor module including a first body defining a first compartment and having a first port defined in a wall of the first body, a first membrane attached to surfaces of the first body, and a first electrically conductive electrode on a major surface of the first membrane, a second micro pressure sensor module arranged in a stack with the first micro pressure sensor module, the second micro pressure sensor module, including a second body defining a second compartment and having a second port defined a wall of the second body, a second membrane attached to surfaces of the second body, and a second electrically conductive electrode on a major surface of the second membrane, with the second membrane in combination with the first membrane and the first body enclosing the first compartment.

The above aspect may include a third micro pressure sensor module arranged in the stack with the first micro pressure sensor module and the second micro pressure sensor module, the third micro pressure sensor module including a third body having a third port in the third body, a third body defining a third compartment and having a third port defined a wall of the third body, a third membrane attached to surfaces of the third body, and a third electrically conductive electrode on a major surface of the third membrane, with the third membrane in combination with the second membrane and the second body enclosing the second compartment.

The micro pressure sensor has the first and third ports as source ports that are fed by a fluid at a source pressure and the second port is a reference port fed by a fluid at a reference pressure. The micro pressure sensor has the first port on a first wall of the first body and remaining walls of the first body are solid walls. The micro pressure sensor has the second port is on a first wall of the second body and remaining walls of the second body are solid walls. The micro pressure sensor is coupled to a capacitance measurement circuit. The micro pressure sensor has the first and second membranes and corresponding electrodes patterned to affect the flexibility of the first and second membranes. The micro pressure sensor wherein patterns to affect the flexibility of the first and second membranes include a channel in the membrane material and a meandered conductor as the electrode.

According to an additional aspect, a micro pressure sensor includes a body having a plurality of walls that define a chamber, a plurality of membranes each having a correspond electrode layer over a surface thereof, the plurality of membranes disposed in the chamber and anchored between two of the plurality of walls of the body forming plural compartments within the chamber, a set of inlets coupled to a first set of the plural compartments, the set of inlets disposed in corresponding portions of a first one of the plurality of walls of the body, with remaining walls of the plurality of walls of the body being a solid portion of the body, and a set of outlets coupled to a second different set of the plural compartments, the set of outlets disposed in corresponding portions of another one of the plurality of walls of the body, with the first one of the plurality of walls of the body and remaining walls, excluding the another one of the walls, of the plurality of walls of the body being a solid portion of the body.

According to an additional aspect, a method of manufacturing a micro pressure sensor includes patterning a first sheet to produce a first body element from the first sheet of flexible plastic material, the body element having a port in a first wall of the body element, with remaining walls of the body element being solid walls and the first wall and remaining walls defining a chamber and laminating a second sheet of a flexible plastic material carry a conductive electrode material to the first sheet to provide a composite laminated structure.

The above aspect may include one or more of the following:

The method further includes patterning the conductive layer on the second sheet to provide isolated regions of the conductive layer that provide electrodes on the second sheet. The method further includes dicing the composite laminated structure into individual dies comprising the body element, stacking the individual dies to produce a stacked structure by alternating the ports to be on opposing sides of the stack, and laminating the stacked structure to produce a component of the microelectromechanical system. The method further includes machining the sheets to affect the flexibility of the sheets. The method wherein the first sheet to produce the first body element is fed from a roll of flexible plastic material.

The micro pressure sensors described herein can be made using micro fabrication methods and can be used for performing pressure sensing for a variety of industrial, medical, and biological applications. The micro pressure sensors described below can be fabricated using reasonably inexpensive techniques and thus provide inexpensive micro pressure sensors for various applications.

The details of one or more embodiments of the invention are set forth in the accompanying drawings and the description below. Other features, objects, and advantages of the invention are apparent from the description and drawings, and from the claims.

DESCRIPTION OF DRAWINGS

FIG. 8 is table showing capacitance vs. membrane separation and pressure.

FIGS. 13A-13B are views depicting details of via conductors.

DETAILED DESCRIPTION

Overview

Micro-pressure sensors described herein are made using micro fabrication methods and can be used for sensing pressure in various industrial, commercial, medical, and biological applications. The micro pressure sensors are fabricated on a micron/millimeter scale. Several fabrication techniques are disclosed.

Micro Pressure Sensors

Figure 1:
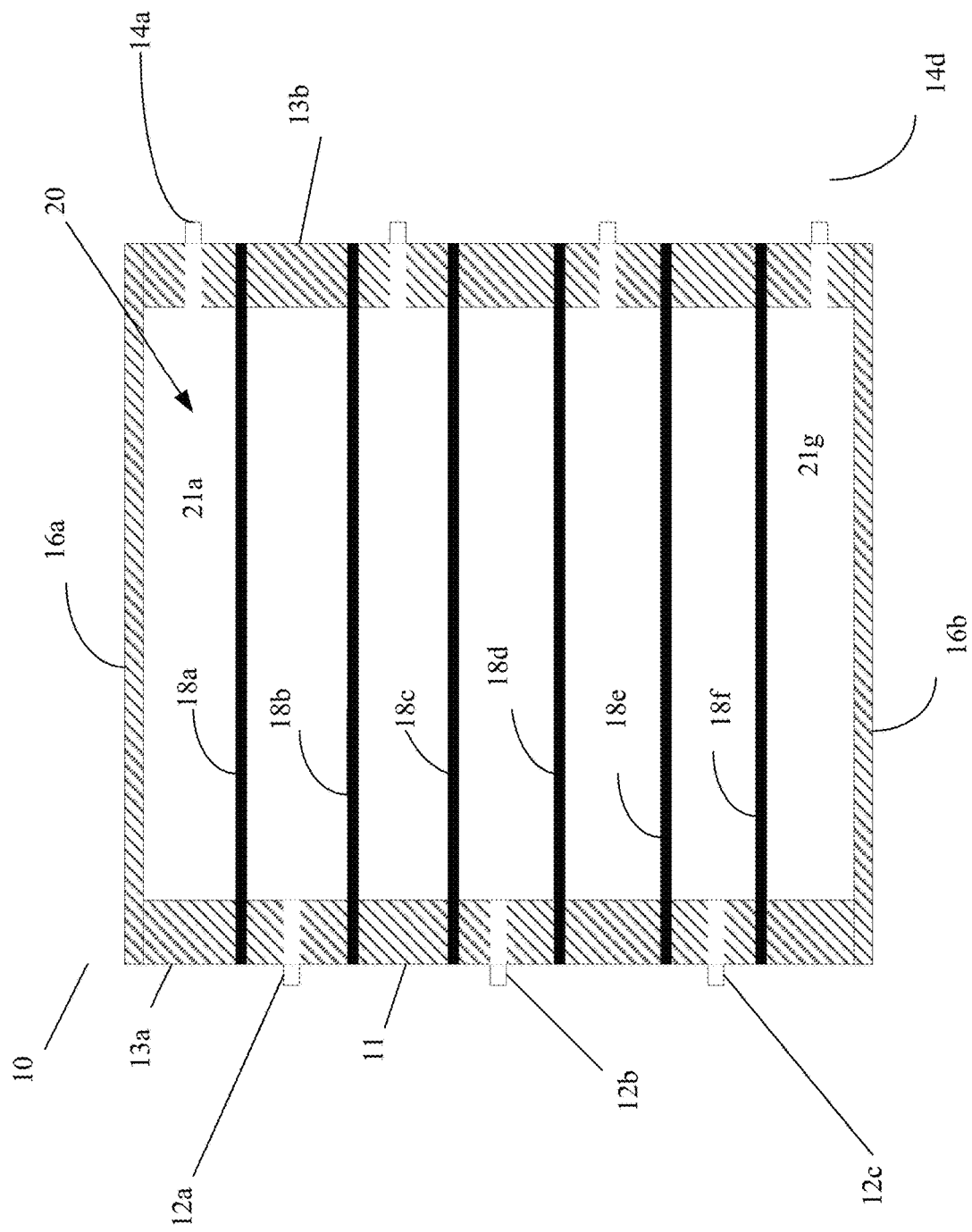
FIGS. 1-3 are schematic functional, cross-sectional diagrams of a micro pressure sensor showing the micro pressure sensor in a rest position, in an overpressure mode, and in an under-pressure mode.

Referring to FIG. 1, a micro pressure sensor 10 includes a single compartmentalized pressure sensor chamber 20. The micro pressure sensor 10 also includes a sensor body 11 having two walls 13a, 13b along a fluid flow direction and two walls, e.g. front and back walls (not shown in the views of FIGS. 1-4) that are orthogonal to two fixed end walls (i.e., end caps) 16a, 16b that are opposite to each other along a direction perpendicular to the fluid flow direction. The walls 13a, 13b and 16a, 16b and the front and back walls define the single chamber 20. The single chamber 20 is compartmentalized by membrane layers (membranes) 18a-18f. Membranes 18a-18f are anchored between the two end walls 16a, 16b and the front and back walls. The membranes 18a-18f extend from wall to wall separating the chamber 20 into plural compartments 21a-21g.

A first set of ports 12a-12c are disposed through wall 13a for fluid access into each of compartments 21b, 21d and 21f, respectively. A second set of ports 14a-14d, are disposed through wall 13b for fluid access into each of compartments 21a, 21c, 21e and 21g, respectively. In this implementation, each compartment 21a-21b includes a port either from the first set of ports 12a-12c or from the second set of ports 14a-14d, but not both, defined in the respective walls. For example, the compartment 21a includes the port 14a in the wall 13b whereas wall 13a in the region of compartment 21a is solid, without any opening.

In FIG. 1, the ports are shown on opposing sides. Ports being on opposing sides is desirable in some embodiments, but is not required. In other embodiments, the ports can be on adjacent sides or indeed on the same side provided that ports acting as inlets or input ports are separated from ports acting as outlets or output ports, by such ports being coupled to different vessels that provide the fluid whose pressure is being measured and the reference. A compartment would have but one inlet or one outlet but not both.

As shown in FIG. 1, this arrangement of a solid wall at one end and a first one of the first set of ports or a first one of the second set of ports at an opposing end is alternated, such as shown for adjacent compartment 21b having port 12a in wall 13a with wall 13b being a solid wall at the region of compartment 21b.

The compartments 21a-21g are fluidically sealed from each other. Two compartments 21a and 21g at the opposite ends of the micro pressure sensor 10 have walls provided by the fixed walls 16a, 16b of the body and a corresponding membrane. Intermediate compartments 21b-21f between the compartments have walls provided by two adjacent membranes with the micro pressure sensor 10 having at least one and generally many intermediate compartments, each of which intermediate compartment walls are provided by two membranes 18a-18f. The micro pressure sensor 10 can sense changes in pressure from a rest position as is illustrated in FIG. 1. Changes in fluid pressures of, e.g., typically gases or in some instances liquids are detected and the micro pressure sensor 10 is constructed with materials, the selection of which takes into consideration the type of fluid that the micro pressure sensor 10 will be configured to sense pressure of as well as a range of pressures over which the micro pressure sensor 10 will have suitable sensitivity.

In the implementations discussed below, pressures are relative to ambient pressure of ambient air. However, other references may be used. Also, while six membranes 18a-18f are shown in the figures, the micro pressure sensor 10 chamber 20 can be extended with additional intermediate compartments, having additional membranes as each compartment can be viewed as a module (see, FIGS. 4-6), with the micro pressure sensor 10 being formed of a stack of such modules, as described further below.

Each membrane 18a-18f has an electrode (not explicitly shown in FIG. 1 attached over a major surface of the membrane 18a-18f. The electrodes are connected to a capacitance measurement circuit (see FIGS. 2, 3) that delivers voltages to the electrodes according to the type of capacitance measurement circuit employed. In some examples of a capacitance measurement circuit, an AC waveform can be used and the capacitance is measured using frequency domain techniques. In other examples of a capacitance measurement circuit, a DC waveform is used to measure capacitance using time domain techniques.

When an external fluid is fed to the micro pressure sensor 10 at the same pressures at the reference pressure, the membranes 18a-18f and thus electrodes are not flexed and the membranes/electrodes are at nominal, rest (quiescent) positions, such as shown in FIG. 1. Each membrane 18a-18f at rest is substantially parallel to the end walls 16a, 16b and the compartments 21a-21g can have the same nominal volume $V_i$, with the membranes 18a-18f in this implementation being separated by equal distances (thickness of the wall portions).

When activated, by application of a pressure, the membranes 18a-18f and thus electrodes flex, changing the volume of the respective compartments and more particularly, the distance separating pairs of electrodes on such membranes 18a-18f. These changes in distance separating pairs of electrodes cause changes in capacitance between pairs of adjacent electrodes, as shown for 18a, 18b in FIGS. 2, 3.

Changes in volume can be considered as an alternative way to represent pressure changes. A capacitor is effectively provided by the combination of a pair of electrodes on a pair of adjacent membranes that are separated by distance provided from the respective compartment. A capacitance characteristic of such effective capacitor is determined by the dielectric constant provided by one of the pair of adjacent membranes, the dielectric of the fluid in the compartment, the area of the electrodes and distance that separates the electrodes, e.g., generally at least approximated by a formula for a parallel plate capacitor, given as:

$C = \varepsilon_r \varepsilon_0 A/d$, where

C is the capacitance, in farads;

A is the area of overlap of the two electrodes, in square meters;

$\varepsilon_r$ is the dielectric constant of the material between the electrodes (sum of dielectric constants of a membrane and fluid);

$\varepsilon_0$ is the electric constant ($\varepsilon_0 \approx 8.854 \times 10\text{-}12$ F·m-1); and d is the separation between the plates, in meters.

where d is sufficiently small with respect to the smallest chord of A.

A controller (see FIGS. 2, 3) that is either part of a capacitance measurement circuit or a separate circuit references a table/algorithm to convert measured capacitance units into pressure units. Many techniques can be used to measure and detect changes in such capacitance over a bulk capacitance provided by the micro sensor 10 while in a rest condition.

In some embodiments, the distance between two adjacent membranes 18a-18b in their nominal positions is about 50 microns. In some implementations, each of the compartments 21a-21g can have similar nominal volumes $V_e$. In such implementations, the distance between the membrane 18a in its nominal position and the end wall 16a or between the membrane 18f in its nominal position and the end wall 16b is about 50 microns. The compartments 21a-21g can also have different sizes. The sizes can be chosen based on, e.g., manufacturing, power consumption, and application considerations. As an example, the micro pressure sensor 10 can have a length of about 1.5 mm, a width of about 1.5 mm, a total height (the cumulative height of different compartments) of 0.05 mm, and a total volume of about 0.1125 mm³. Other configurations are possible.

Compared to a conventional pressure sensor used for similar purposes, the micro pressure sensor 10 may use less material, and thus is subject to less stress. The micro pressure sensor 10 has a size in the micron to millimeter scale, and can provide wide ranges of pressure measurements.

The described micro pressure sensor 10 is a capacitance type of sensor. Sensing occurs in either of two alternating operations of a fluid overpressure and fluid under pressure in the chamber 20 of the micro pressure sensor 10.

Figure 2:
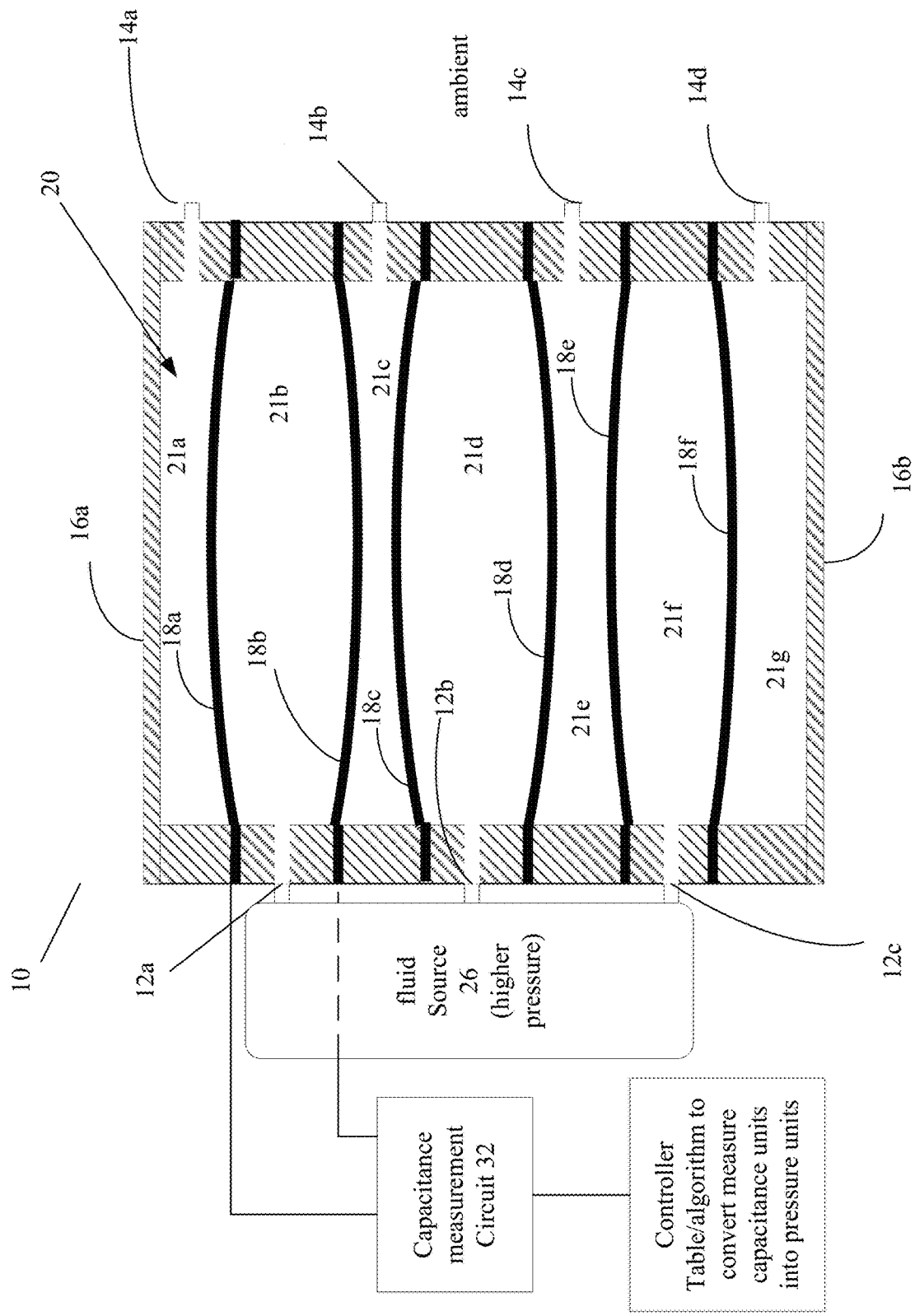

Referring to FIG. 2, with application of an overpressure (higher pressure at ports 12a, 12b and 12c acting as inlets compared to a reference at ports 14a-14d acting as outlets) from a fluid source 26, end compartments 21a and 21g are shown compressed as are the intermediate compartments 22c, 21e. The compression occurs in the end compartments 21a, 21g when membranes 18a, 18f move towards respective end walls 16a, 16b and for the intermediate compartments, 22c, 21e when adjacent membranes 18b, 18c and 18d, 18e move towards each other occupying space of the adjacent compartments 22c, 21e due to displacement of air from those compartments 22c, 22e. The movement of these membranes 18a-18f reduces the volume of the respective end compartments 21a, 21g and intermediate compartments 21c, 21e to discharge fluid (gas or liquid) from those compartments into the ambient (or reference). Simultaneous to the compression of those compartments, adjacent compartments 21b, 21d, 21f (all being intermediate compartments) are over pressured when respective sets of membranes 18a, 18b; 18c, 18d; and 18e, 18f, move away from each other to expand the respective compartment volumes.

In the overpressure operation (FIG. 2), the inlets 12a-12c into the chamber 20 are fed a fluid under a pressure higher than the reference pressure (ambient in this case) causing the membranes 18a-18f to flex as shown. That is, when a fluid is fed into port 12a (acting as an input port), adjacent membranes 18a, 18b defining compartment 21b will flex or deform away from each other towards adjacent compartments 21a and 21c, displacing air from those compartment 21a, 21c through ports 14a, 14b (acting as output ports) into the ambient. Similarly, the other membranes will likewise flex or bend upon fluid at pressure being introduced into the remaining ports 12b, 12c.

Figure 3:
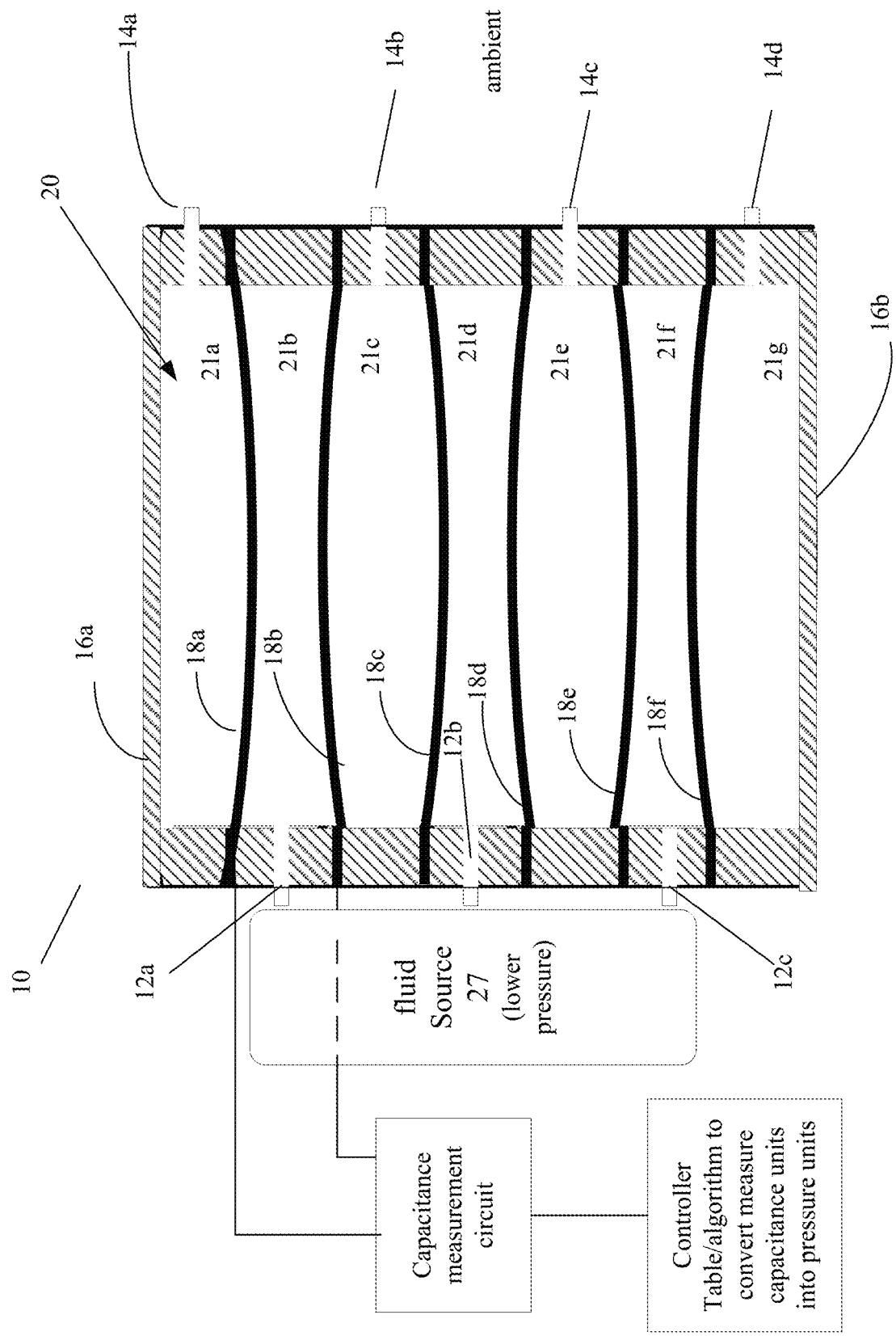

Referring now to FIG. 3, in an under-pressure (lower pressure than a reference, e.g., down to a vacuum pressure), at ports acting as inlets 12a-12c compared to a reference at ports acting as outlets, end compartments 21a, 21g are shown expanded as are the intermediate compartments 21c and 21d. The expansion occurs in the end compartments 12a, 21g when membranes 18a, 18f move away from end walls 16a, 16b and for compartments 21c, 21d when adjacent membranes 18b, 18c and 18 move away from each other. The movement of these membranes increases the volume of the respective end compartments 21a, 21g and intermediate compartments 21c, 21d, due to the charge of fluid (gas or liquid) into the compartments coupled to the ambient or reference. Simultaneous to the expansion of those compartments, adjacent compartments 21b, 21d and 21f (all here being intermediate compartments) are discharged when respective sets of membranes move towards each other to reduce the respective compartment volumes.

In the under pressure operation (FIG. 3), the ports 12a-12c into the chamber 20 are coupled to a fluid source 27 that is at a pressure lower than the reference pressure (ambient in this case) causing the membranes to flex, as shown. That is, when a fluid at an under pressure is fed into port 12a, adjacent membranes 18a, 18b defining compartment 21b will flex or deform towards each other away from adjacent compartments 21a and 21c, causing ambient air to enter those compartments 21a, 21c through ports 14a, 14b from the ambient. Similarly, the other membranes 18c, 18d and 18e, 18f will likewise flex or bend towards each other in response to the fluid at an under pressure being introduced into the remaining ports 12b, 12c, by ambient entering compartments 21e, 21g through ports 14c-14d.

Removal of the over pressure or the under pressure applied to the ports returns the micro pressure sensor 10 to the nominal state of FIG. 1.

The micro pressure sensor 10 discussed above thus comprises multiple membranes 18a-18f each anchored between two fixed walls 13a, 13b and two fixed walls not shown in those views. The fixed walls 13a, 13b and the not depicted walls are body layers that form multiple compartments separated by pairs of adjacent membranes. The first and last ones of the compartments are formed by a membrane and a fixed wall that is part of an end cap of the body, but intermediate compartments are provided by pairs of adjacent membranes.

Comparing FIGS. 2 and 3 that show two operational states of the same micro pressure sensor 10 indicates that in a first mode, pressure higher than the reference is measured, and in a second mode pressure lower than the reference is measured. That is, when actuated, each membrane of a compartment can move in two opposite directions about a central, nominal location at which the membrane rests when it is not actuated.

The electrodes (not explicitly shown in FIGS. 1-3) on the membranes of the micro pressure sensor 10 are connected in parallel to a capacitance measurement circuit 32. The combination of two membranes with electrodes, separated by dielectric (the dielectric of the membrane material and air in the compartments) form capacitors. The capacitance of these "capacitors" can be measured via conventional capacitance measurement circuits 32. A correlation can be provided between measured capacitance and pressure such as by a controller 34. Various implementations are possible.

Micro pressure sensors having the above described features can be manufactured using various methods such as MEMS processing techniques and so-called roll to roll (R2R) processing. The materials for a micro pressure sensor 10 are chosen based on the features to be provided by the micro pressure sensor 10 and the method of manufacturing of the micro pressure sensor 10. Below are some criteria for choosing the materials of the different parts of micro pressure sensor 10.

Sensor body—The material used for the body may be defined by the requirements. In general, the material needs to be strong or stiff enough to hold its shape to produce the compartment volume. In some implementations, the material is etchable or photo sensitive so that its features can be defined and machined/developed. Sometimes it is also desirable that the material interact well, e.g., adheres, with the other materials in the sensor. Furthermore, the material is electrically non-conductive. Examples of suitable materials include SU8 (negative epoxy resist), and PMMA (Polymethyl methacrylate) resist.

Membrane—The material for this part forms a tympanic structure that charges and discharges fluid in the chamber. As such, the material is required to bend or stretch back and forth over a desired distance and have elastic characteristics. The membrane material is impermeable to the fluids of interest, including gas and liquids, is electrically non-conductive, and can have either a low or a high breakdown voltage characteristic. Examples of suitable materials include silicon nitride, and Teflon. Others are possible.

Electrodes—The material of the electrodes is electrically conductive. Because the electrodes do not conduct significant amounts of current, the material can have a high electrical sheet resistance, although the high resistance feature is not necessarily desirable. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include very thin layers of gold and platinum. Others are possible.

Electrical interconnects—The voltages from the capacitance measurement circuits are conducted to the electrode on each membrane of each compartment. Electrically conducting paths to these electrodes can be built using conductive materials, e.g., gold and platinum.

Other materials—when MEMS processing is used in manufacturing the micro pressure sensor, a sacrificial filling material, e.g., polyvinyl alcohol (PVA), can be used. The sacrificial filling material may also be used in R2R processing. In some implementations, solvents are used in the manufacturing process, which may place additional requirements on the various building materials of the micro pressure sensor. It may be possible to print some of the electrical circuit components onto the membranes. In general, while certain materials have been specified above, other materials having similar properties to those mentioned could be used.

Referring now to FIGS. 4-7, a modularized, stacked micro pressure sensor 50 in various stages of fabrication is shown. This modularized, stacked micro pressure sensor 50 is a modular implementation of the micro pressure sensor 10 discussed above.

Figure 4:
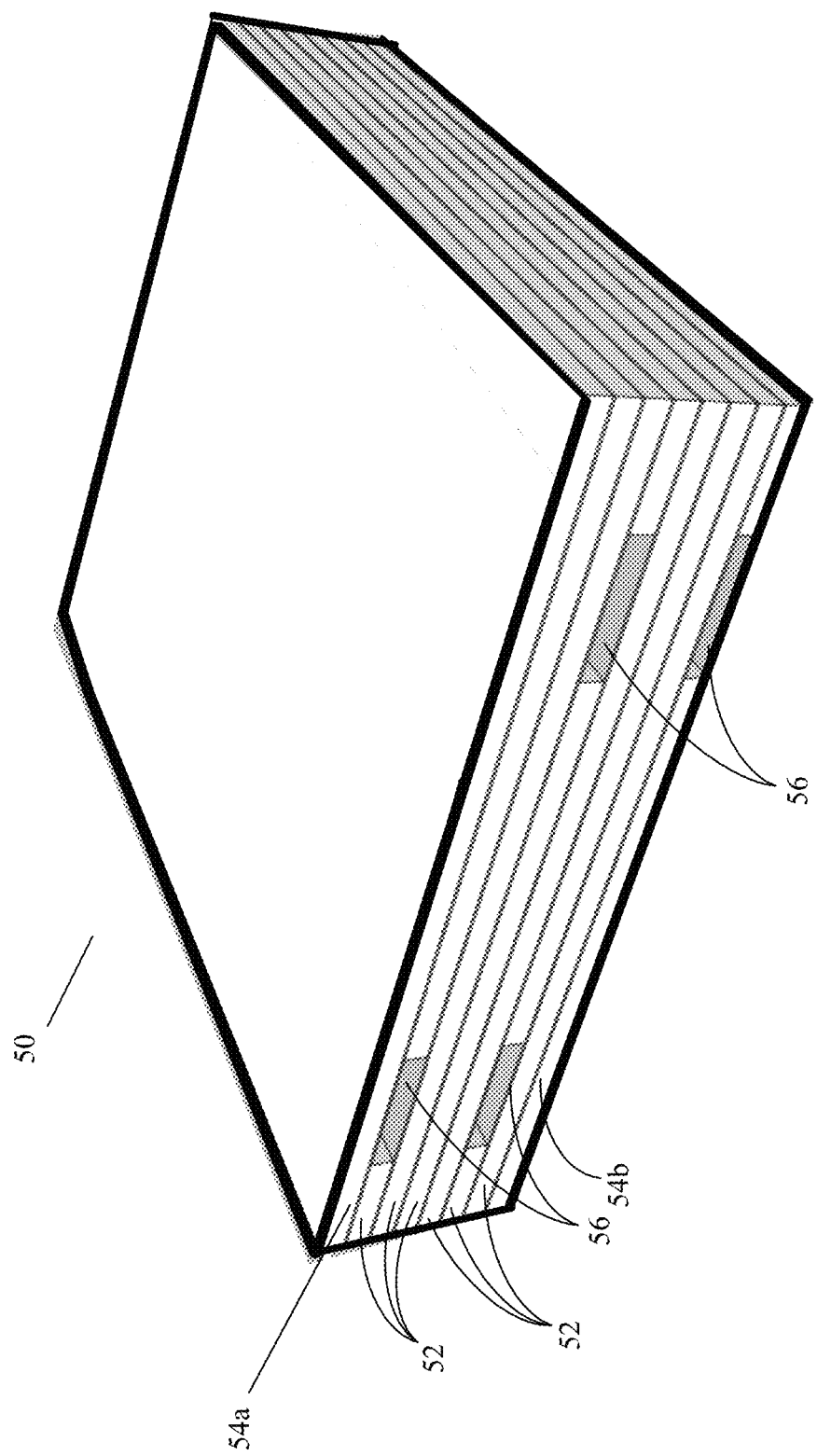
FIG. 4 is an assembled isometric view of a modular micro pressure sensor based on the concepts described in FIGS. 1-3.

Referring to FIG. 4, the modularized, stacked micro pressure sensor 50 is comprised of stacked micro pressure sensor module layers 52 to form intermediate compartments of the stacked micro pressure sensor and end cap layers (54a, 54b). The end caps 54a, 54b form fixed walls (similar to walls 13a, 13b in FIGS. 1-3). The module layers are stacked over each other providing intermediate electrode-membrane layers. Each module layer 52 (also referred to herein as a repeatable composite layer) has an opening 56 in one of here, four walls. The module layers are alternated such that the opening 56 in one layer 52 is on a side of the stacked micro pressure sensor directly opposite the side having the opening in adjacent module layers, as shown in FIG. 5 for body layers.

Figure 5A:
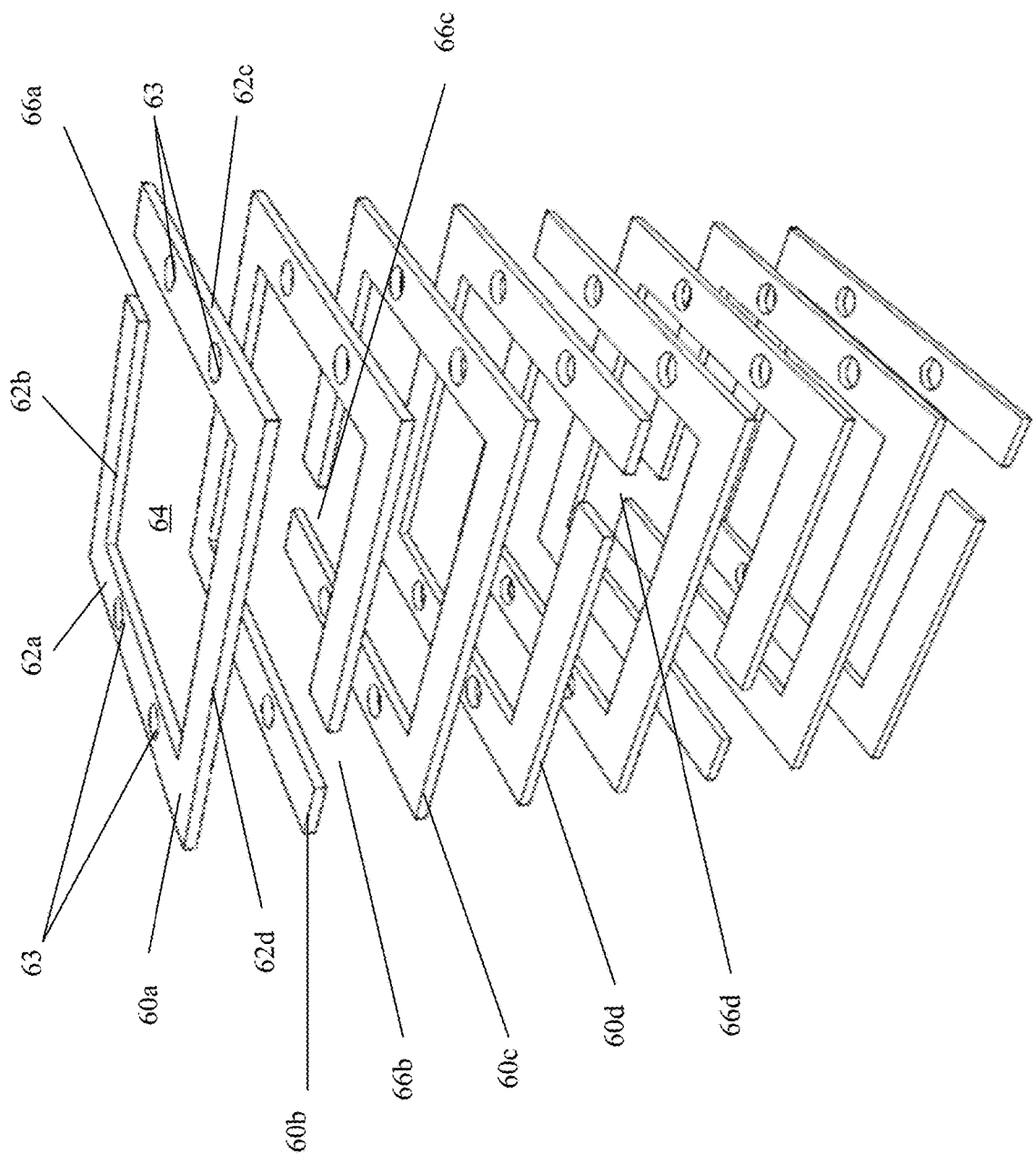
FIG. 5A is an isometric exploded view of body layers or frames used in the modular micro pressure sensor of FIG. 4.

Referring now to FIG. 5A, plural body layers generally 60 are shown (only the first four 60a-60d being referenced). Each body layer 60 has four walls 62a-62d that surround an opening 64. Along two parallel walls, e.g., 62a, 62c are disposed apertures 63 that will be used to make selective electrical contact with electrodes disposed on membranes (both not shown in FIG. 5) as discussed below. The body layers 60 form the intermediate portion of the body of the modularized, stacked micro pressure sensor 50 between end caps 54a 54b (FIG. 4). The view of the plural body layers 60 is provided to show staggering or arrangement of ports 66a-66d on adjacent ones of the plural body layers 60a-60d. The body layer 60a has its port 66a on a first side of wall 62b, whereas adjacent body layer 60a has its port 66b on a first side of wall 62d. The next body layer 60c has its port 66c on a second side of wall 62b, whereas adjacent body layer 60d has its port 66d on a second side of wall 62d.

Figure 5B:
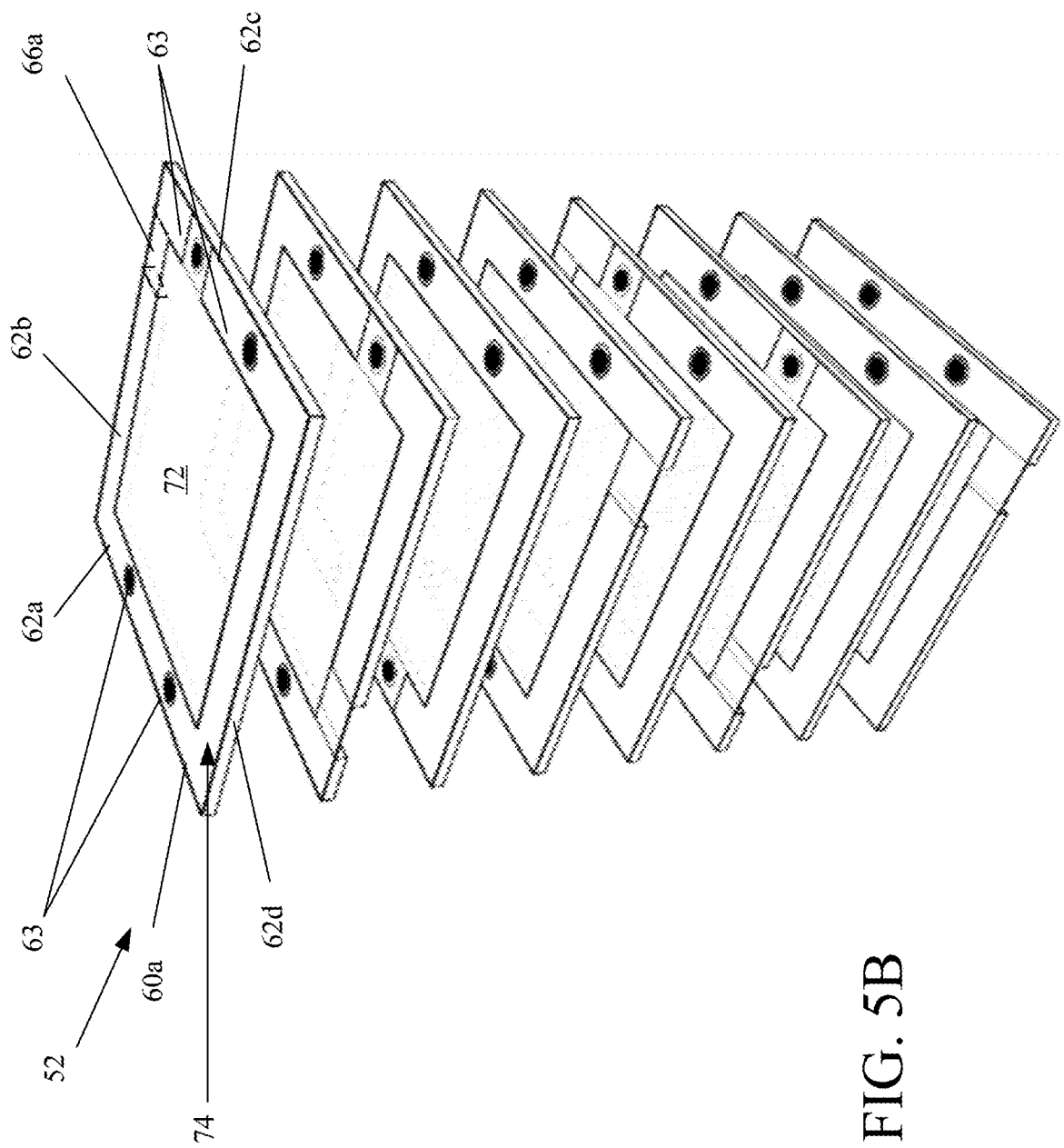
FIG. 5B is an exploded isometric view of module layers or repeatable composite layers used in the modular micro pressure sensor of FIG. 4.

Referring now to FIG. 5B, the plural modules generally 52 are shown each supporting a membrane 74 and electrode 72 (referenced for the first one of the modules 52). The membrane 74 is affixed to the walls 62a-62d of the corresponding body layer and along the two parallel walls, e.g., 62a, 62c are disposed the apertures 63 that are used to make selective electrical contact with the electrodes 72 via the tabs 75. In FIG. 5B, the staggering or arrangement of ports 66a-66d on adjacent ones of the modules 60a-60d as well as staggering of connections of electrodes using vias through tabs 75 is also shown.

Figure 6:
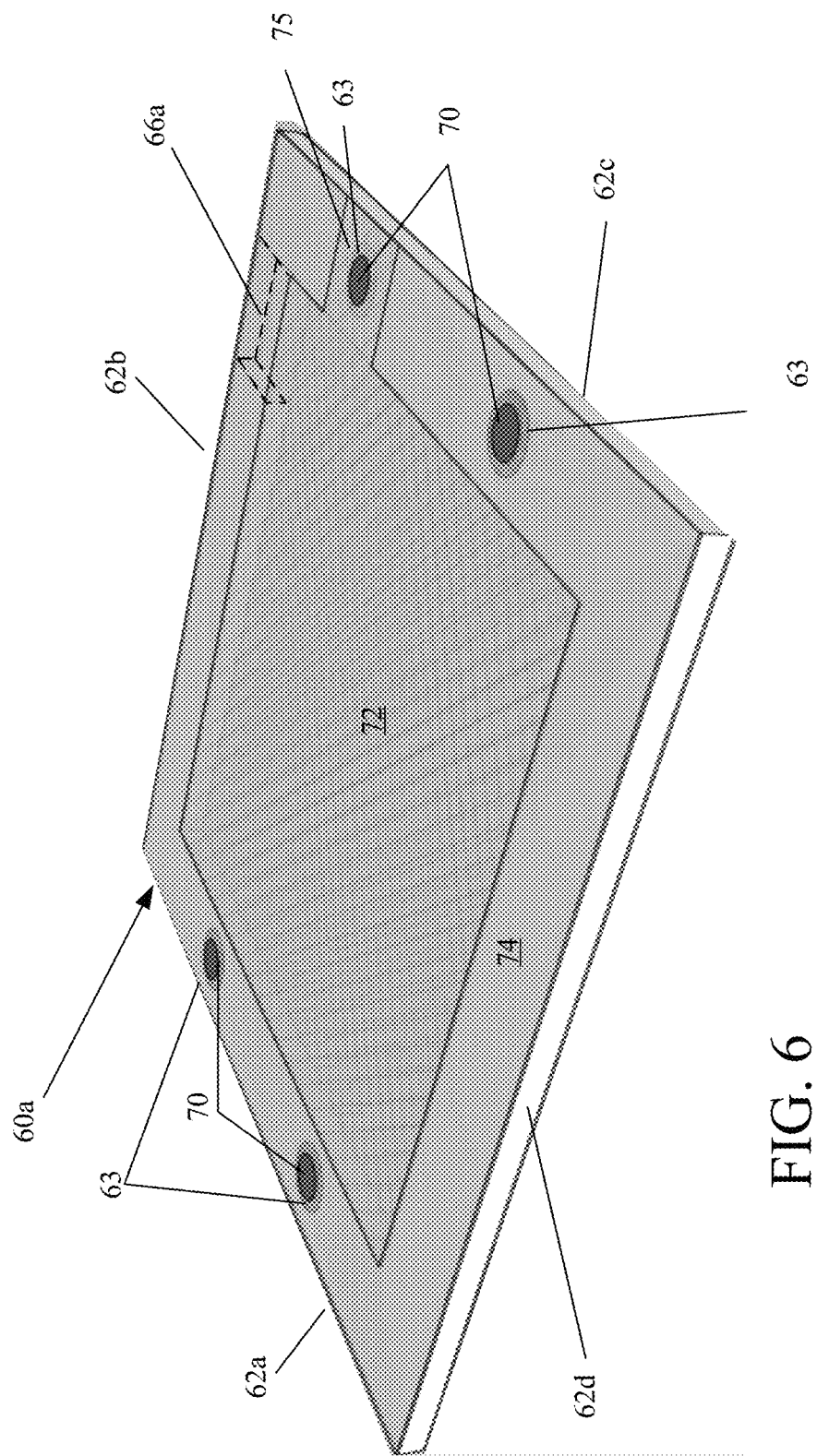
FIG. 6 is an isometric view of a module or repeatable composite layer.

Referring now to FIG. 6, an exemplary module layer 52 is shown. The module layer 52 includes in this example, the body layer 60a having the opening 66a (shown in phantom) and having apertures 63 that are shown filled with conductive material 70. An electrode 72 (as referred to above) is disposed over a membrane layer 74 that is affixed to the walls 62a-62d of the body layer 60b. The electrode 72 includes a lead or tab 75 to be connected to the capacitance measurement circuit external to the stacked micro pressure sensor body through a conductive via formed by adding the conductive material 70 through aperture 63. The combination of a body layer 60, a membrane 74 and an electrode 72 with a single opening 66 provides module layer 52 that is stackable. Stacking one module layer 52 over another module layer 52 forms there between one of the compartments 21b-21f (FIGS. 2-3).

Each membrane 74 of the micro pressure sensor 50 moves in two opposite directions relative to its central, nominal position. Accordingly, to expand or reduce a distance between a pair of electrodes 72 and thus increase or decrease capacitance, the membrane 74 travels a distance less than, e.g., half of, the distance of the compartment (height) provided by stacking two of the module layers 52. As a result, the membrane 74 experiences less flexing and less stress, leading to longer life and allowing for greater choice of materials. In addition, because each one of the membranes 74 carries but one electrode 72, and capacitance is being sensed the electrodes 74 on these membranes can be connected, such that the capacitors formed by the electrodes 74 are connected in parallel. Capacitors connected in parallel add in capacitance. Thus by connecting the capacitors formed by the membranes and pairs of electrodes in parallel, the overall structure will have a higher capacitance and thus as shown below greater sensitivity compared a single capacitor formed by a single membrane and pair of electrodes.

The membrane 74, the end caps 54a, 54b (FIG. 4), and the body layer 60 can have the same dimensions, and the electrodes 72 can have smaller dimensions than the membrane 74 or the other elements. In some implementations, the membrane 74 has a dimension of about microns by microns to about millimeters by millimeters, and a thickness of about 5 microns. The body 60 has an outer dimension of about microns by microns to about millimeters by millimeters, a thickness of about 50 microns, and an inner dimension of about microns by microns to about millimeters by millimeters. The thickness of the body defines the nominal size of the compartment (similar to compartments FIG. 1). The electrodes have dimensions that substantially correspond to inner dimensions of the body. In some implementations, the electrodes have a surface area of about 2.25 mm$^2$ and a thickness of about 0.01 microns (100 Angstroms). An assembled module layer was shown in FIG. 4.

The electrode layer leads or tabs 75 connect the electrodes to the measurement circuit through vias 66 provided through one of the holes 63 according to a requisite connection scheme. Each module 60 has one hole 63 that contacts one tab 75. A stack of four modules thus is used to contact each of the four holes. Thus, as shown the electrode in the top module contacts the first hole and the electrode in the fifth module in the stack contacts the hole in the corresponding location as the hole in the first module.

The electrodes 74 can be a pre-prepared sheet to be attached to the other elements. The electrodes 74 can be formed directly onto those elements, e.g., by printing or with other techniques discussed below. Thus multiple, e.g., two, three, or any desired number of, module layers are stacked on top of each other to form multiple intermediate compartments in a modularized, stacked micro pressure sensor 50. In the stack, each membrane is separated by the body and each body is separated by a membrane. To form a complete modularized, stacked micro pressure sensor, the end caps 51a, 54b are placed on each of the top and bottom ends of the stack of modules so that the end caps on the modules form the two fixed end walls of the modularized, stacked micro pressure sensor, as shown in FIG. 1 and FIG. 4.

The module layer stack can be viewed as module layers and hence capacitors connected in parallel. The volume of each individual module layer, $V_i$ or $V_e$, is small. In some implementations, even the total volume of all layers in the stack is relatively small. In some implementations, multiple stacks can be connected in parallel to increase the total capacitance. Similarly, the pressure handling capability of an individual micro pressure sensor is relatively low. Even though there are multiple module layers in a stack, the layers do not increase the total pressure of the stack because they are connected in parallel.

Figure 7:
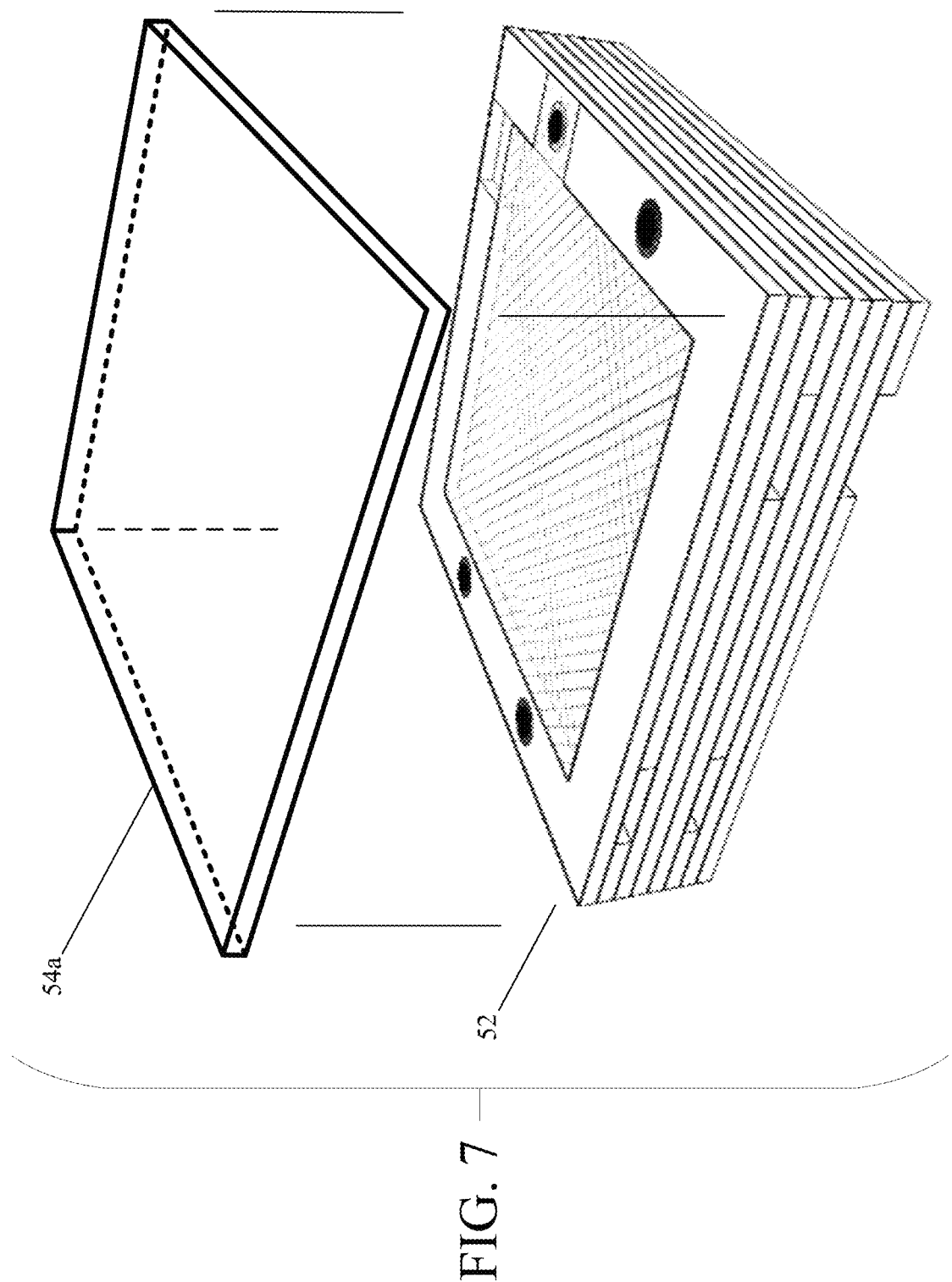
FIG. 7 is an isometric exploded view of modules and an end cap.

Referring to FIG. 7, intermediate compartments of FIG. 6 that are similar to the compartments of FIGS. 1-3, formed using a body layer and a corresponding membrane layer with electrode, as shown. In FIG. 7 an end cap 54a is shown disposed over the module 52.

Referring now to FIG. 8, a table of exemplary, calculated values of capacitance for one module and seven module layers. The micro pressure sensor 50 calculated capacitance values are in pico-farads for one module and seven module micro pressure sensors, with separations (distances between electrodes) and corresponding pressures expressed in cm of water. At 50 microns, separation (resting state) the capacitance of one capacitor is 0.38 pF and for seven 2.68 pF, with 0.00 cm of water pressure.

Figure 9:
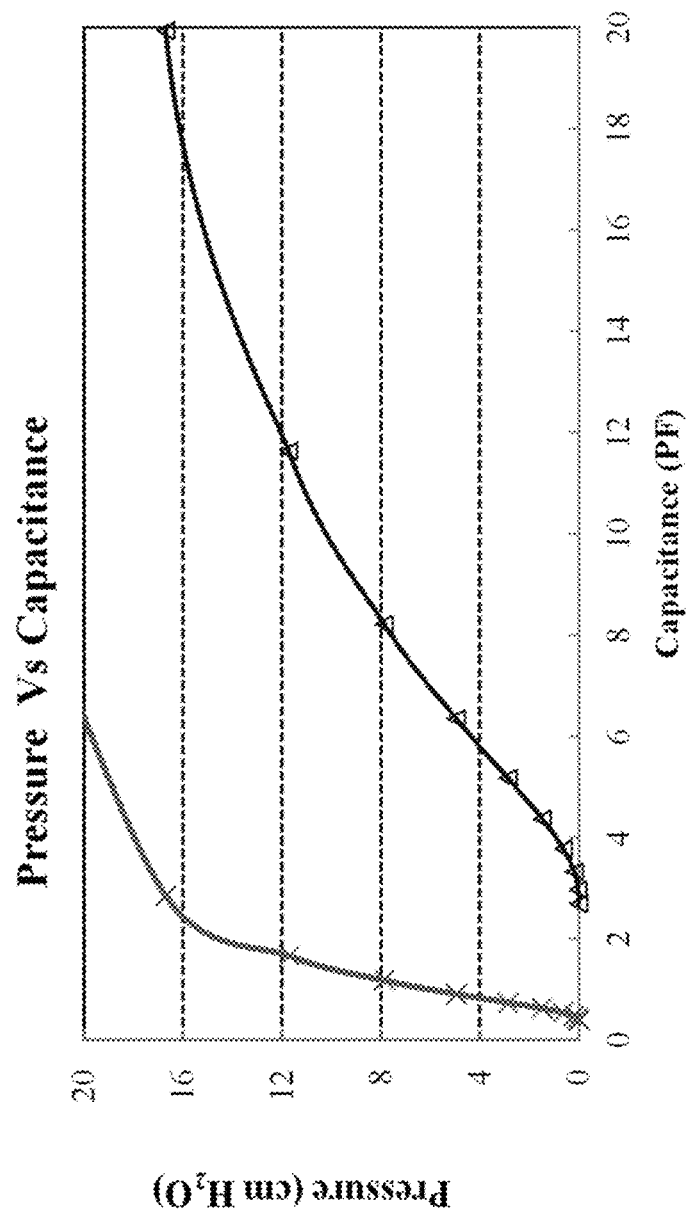
FIG. 9 is a plot of pressure vs. capacitance.
Figure 10:
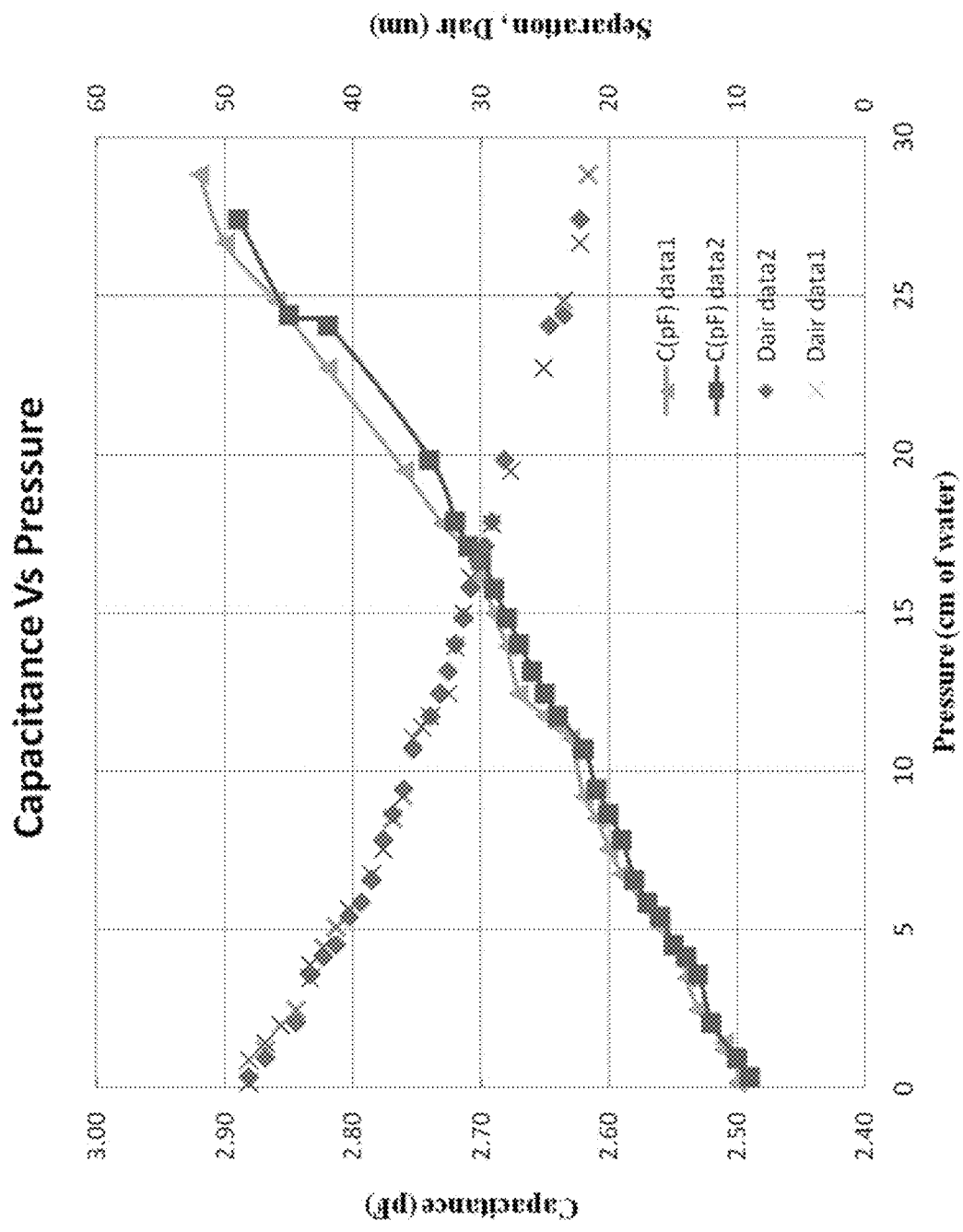
FIG. 10 are plots of capacitance v. pressure and membrane separation vs. pressure.

FIGS. 9 and 10 show exemplary plots for micro pressure sensors, with FIG. 8 plotting pressure (cm of water) vs. capacitance in pF for one and seven modules (capacitors). With seven modules as also shown by the table, a greater range in capacitance is provided for the same pressure range in comparison to capacitance range for one capacitor (module). FIG. 10 shows that capacitance vs. pressure and separation vs. pressure to be substantially linear in the operating range of the micro pressure sensor.

Roll to Roll Processing for Producing Micro Pressure Sensors

Figure 11:
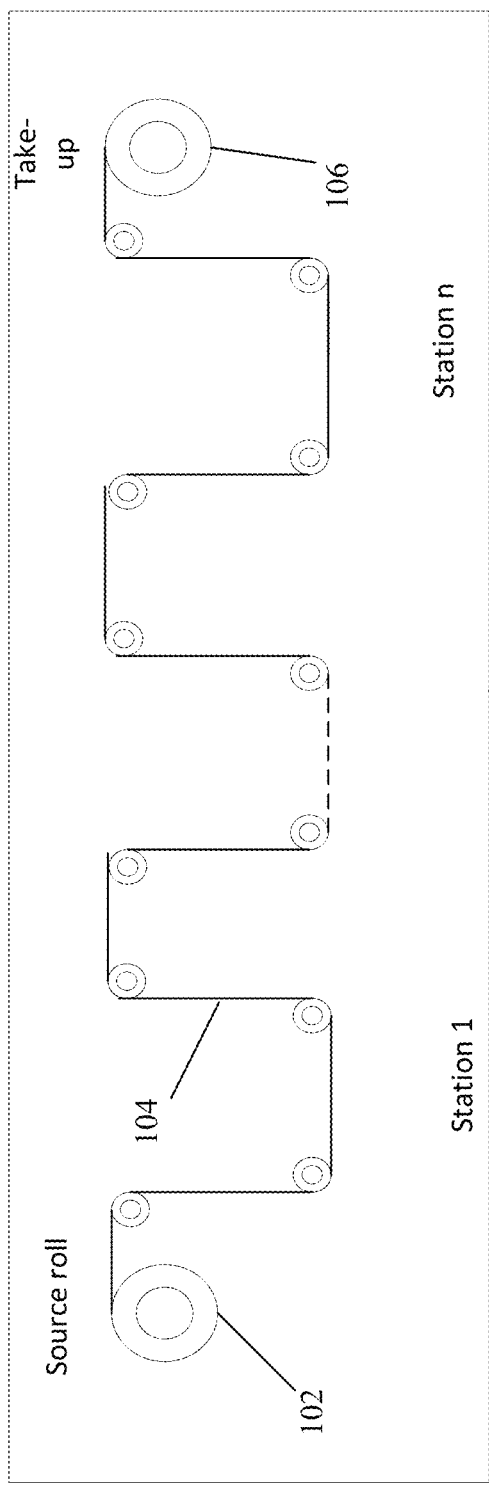
FIG. 11 is a conceptual diagram of a roll to roll processing configuration.
Figure 11A:
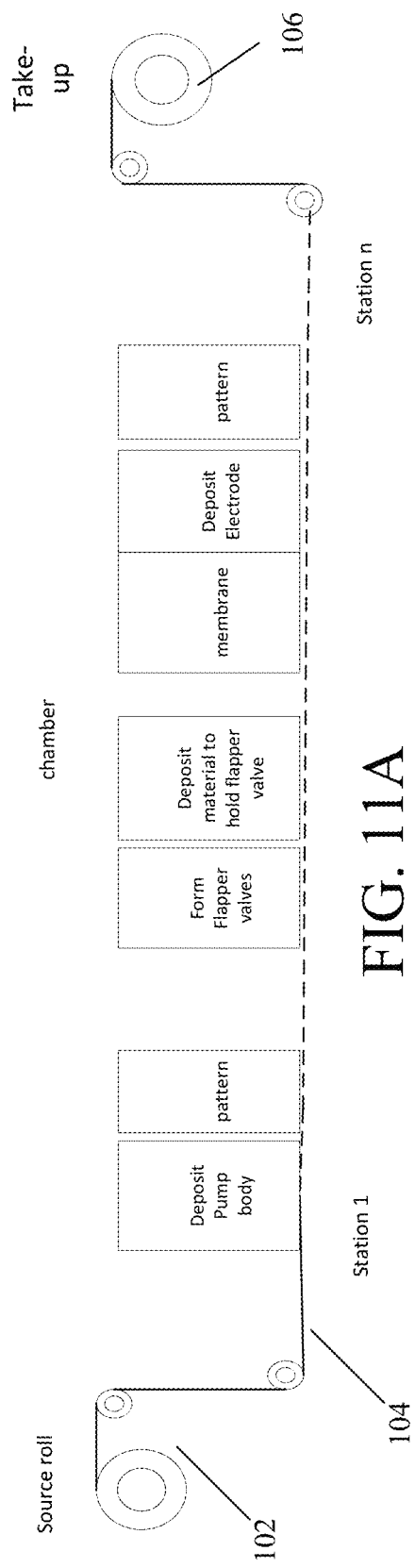
FIG. 11A is a conceptual view of some of the exemplary roll to roll processing stations for the structure of FIG. 6.

Referring to FIGS. 11, 11A, a conceptual view of a roll to roll processing line 100 is illustrated. The processing line comprises several stations, e.g., station 1 to station n (that can be or include enclosed chambers) at which deposition, patterning, and other processing occurs. Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, gravure and flexographic (offset) printing depending on resolution of features being patterned. Ink jet printing and screen printing can be used to put down functional materials such as conductors. Other techniques such as punching, imprinting and embossing can be used.

An original raw material roll 102 is of a web 104 of flexible material. In roll to roll processing the web of flexible material can be any such material and is typically glass or a plastic or a stainless steel. While any of these materials (or others) could be used, plastic has the advantage of lower cost considerations over glass and stainless steel. Specific materials will be determined according to the application of the micro pressure sensor. In applications materials such as stainless steel or other materials that can withstand encountered temperatures would be used, such as Teflon and other plastics that can withstand encountered temperatures.

For the structure shown in FIGS. 1 and 4, stations 1 to n within a roll to roll processing line 100 are set up according to the processing required. Thus, while the end cap and top caps could be formed on the web or plastic sheet 104 in one implementation the end and top caps are provided after formation of the micro-pressure sensor stack, as will be described.

The plastic web (web) 104 is used to support the body (FIG. 4) by a deposition of material on the web 104 at a deposition station followed by patterning station. The body is formed at a forming station. The web 104 having the body has a membrane deposited over the body at a station. Over the membrane is deposited an electrode at deposition station which is patterned at patterning station. Membrane sheet with patterned electrodes supported on the membrane are provided on the body. Electrical interconnects, for connecting to the electrodes on each membrane, are provided by depositing conductive materials, e.g., gold, silver, and platinum layers (or conductive inks such as silver inks and the like). In some implementations some of the electrical circuit components are printed onto the membranes. Upon completion of fabrication, the web is taken up (rolled back onto) a take-up roll 106

The taken up roll 106 having the micro module units (body and membrane with electrode and electrical connections) are diced and the micro module units are collected, assembled into stacks of micro modules, and packaged by including the end and top caps to provide the micro pressure sensor FIG. 4. Depending upon the layout of the units on the web it may be possible to fold the web of the module units into a stack of units, with electrodes provided on the membrane layer or whole layers of many units can be laminated together to produce a stack prior to being diced and packaged.

The membrane material is required to bend or stretch back and forth over a desired distance and thus should have elastic characteristics. The membrane material is impermeable to fluids, including gas and liquids, is electrically non-conductive, and possesses a high breakdown voltage. Examples of suitable materials include silicon nitride and Teflon.

The material of the electrodes is electrically conductive. The electrodes do not conduct significant current. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include, e.g., gold, silver, and platinum layers (or conductive inks such as silver inks and the like). A release material can be used for allowing for valve movement. Suitable release materials include, e.g., the sacrificial filling material mentioned above.

Figure 12A:
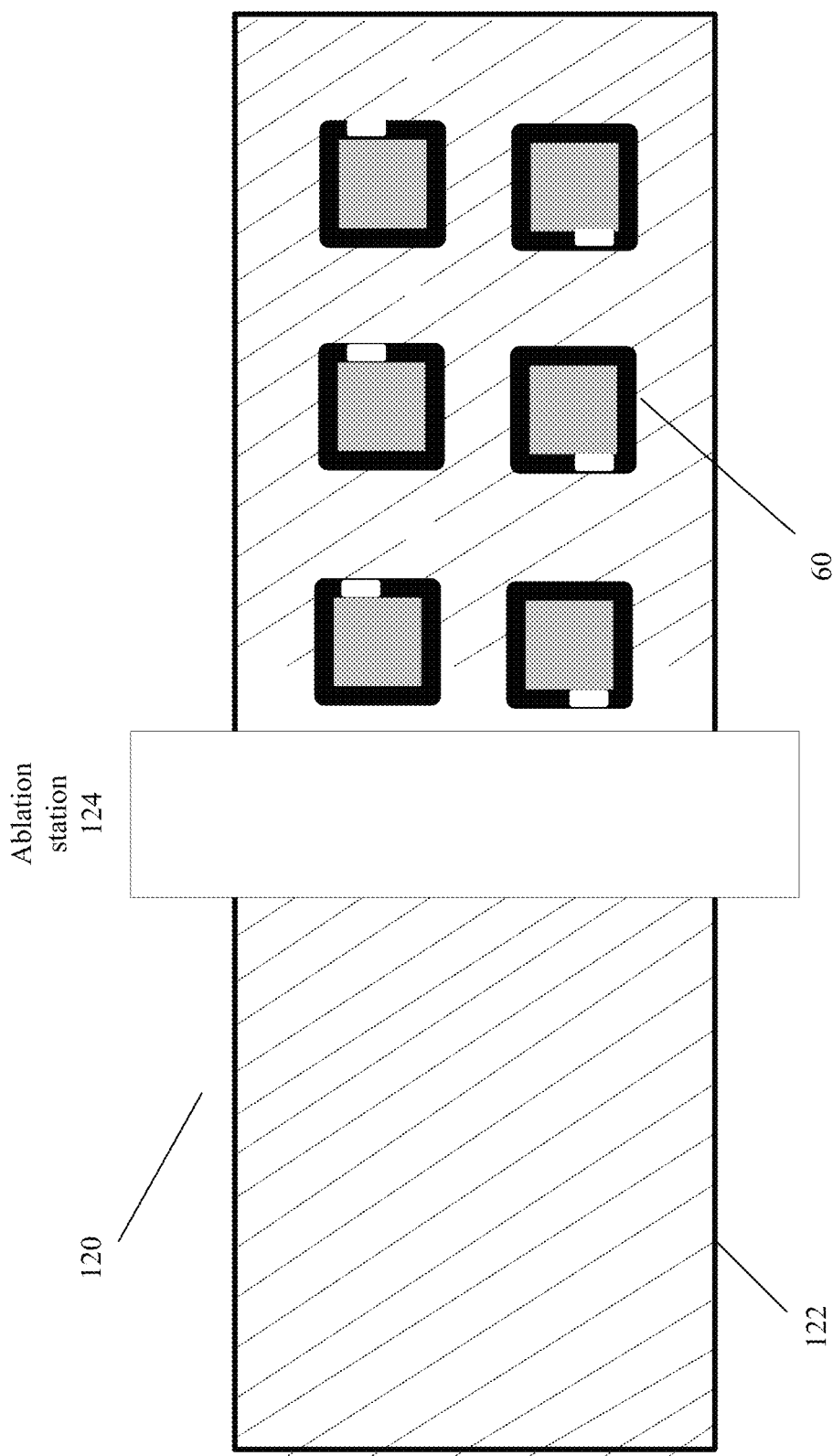
FIGS. 12A-12C are views of roll to roll processing for the structure of FIG. 6.
Figure 12B:
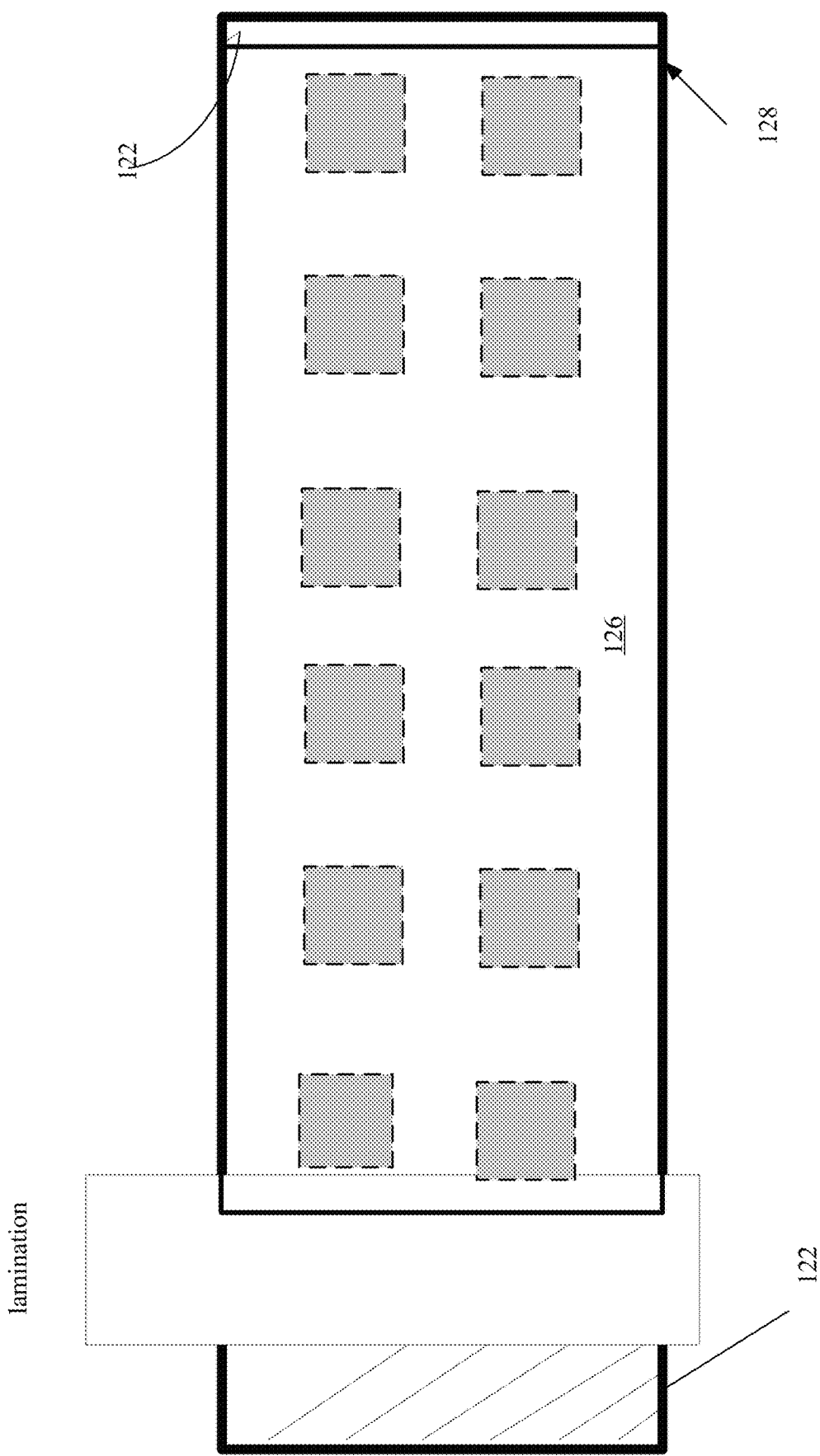

Referring to FIGS. 12A-12B, an alternative roll to roll processing approach 120 to provide the micro pressure sensor (FIG. 4) is shown. The micro pressure sensor has the membranes, which flex in operation. The micro pressure sensor is fabricated using roll to roll processing where a raw sheet 122 (or multiple raw sheets) of material is passed through plural stations to have features applied to the sheet (or sheets) and the sheet (or sheets) are subsequently taken up to form parts of the repeatable composite layers (See FIGS. 4-7) to ultimately produce a composite sheet of fabricated micro pressure sensors.

Referring to FIG. 12A, the sheet 122 of a flexible material such as a glass or a plastic or a stainless steel is used as a web. For the particular implementation of the micro pressure sensor the material is a plastic sheet, e.g., Polyethylene terephthalate (PET). The sheet is a 50 micron thick sheet of PET. Other thicknesses could be used (e.g., the sheet 122 could have a thickness between, e.g., 25 microns and 250 microns (or greater). The thicknesses are predicated on desired properties of the micro pressure sensor and the handling capabilities of roll to roll processing lines. These considerations will provide a practical limitation on the maximum thickness. Similarly, the minimum thicknesses are predicated on the desired properties of the micro pressure sensor to be constructed and the ability to handle very thin sheets in roll to roll processing lines.

For the micro pressure sensor 10, 50, the layers would have thicknesses as mentioned above approximately 50 microns for the body and 5 microns for the membrane elements of the micro pressure sensor. However, other thicknesses are possible. The sheet 122 is micro-machined using a mask or direct write to configure a laser ablation station 124 to define or form from the compartment, as well as alignment holes (not shown but will be discussed below). Via holes are also provided for electrical connections. The micro-machining ablates away the plastic to form the compartment while leaving the frame portion of the body.

Referring now to FIG. 12B, the sheet 122 with the defined compartment is laminated at a lamination station to a second sheet 126, e.g., 5 micron thick sheet of PET, with a metallic layer of Al of 100 A on a top surface of the sheet. This second sheet 126 forms the membranes over the bodies provided by the defined features of the compartment. The second sheet 126 is also machined to provide the alignment holes (not shown).

Prior to lamination of the second sheet 126 to the first sheet 122, the second sheet 126 is also provided with several randomly dispersed holes or view ports (not shown) over some areas that will be in alignment with the body structures 60. These randomly dispersed holes are used by a machine vision system to reveal and recognize underlying features of the body units 60 on the first sheet. Data is generated by noting the recognized features in the first sheet through the random holes. These data will be used to align a third ablation station when forming electrodes from the layer over the bodies 60.

The second sheet 126 is laminated to and thus sticks (or adheres) to the first sheet 122 in areas where there is plastic on the first sheet 122 and plastic on the second sheet 126. At this point, a composite sheet 128 of repeatable units of the micro pressure sensor are formed, but without electrodes.

The machine vision system produces a data file that is used by the laser ablation system in aligning a laser ablation station with a mask (or direct write) such that a laser beam from the laser ablation system provides the electrodes according to the mask, with the electrodes in registration with the corresponding portions of the bodies. The electrodes are formed by ablating away the metal in regions that are not part of the electrodes and conductors, leaving isolated electrodes and conductors on the sheet. The registration of the patterned electrodes to the body is thus provided by using the machine vision system to observe features on the front side of the laminated structure providing positioning data that the laser ablation system uses to align a laser beam with a mask, using techniques commonly found in the industry.

Figure 12C:
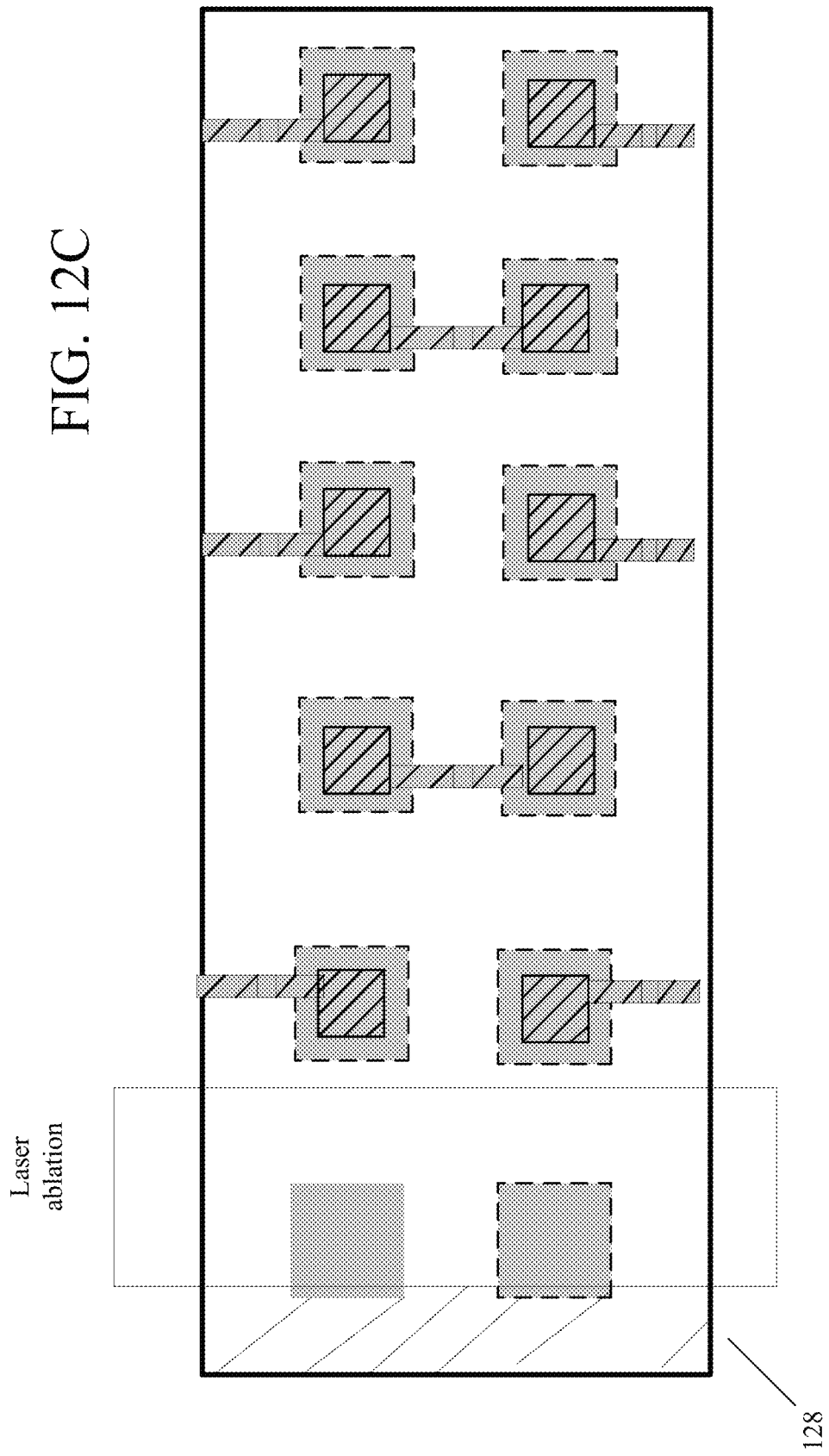

Referring now to FIG. 12C, the composite sheet 128 is fed to the laser ablation station to form the electrodes by ablating the 100 A° Al layer deposited on the second sheet that formed the membrane. The composite sheet is patterned according to the mask to define the electrodes over corresponding regions of the body. The ablation station ablates away metal from the metal layer leaving isolated electrodes on the sheet.

A jig (not shown) that includes four vertical posts can be mounted to a horizontal base and used to stack individual ones of the cut dies. On the jig an end cap (e.g., a 50 micron PET sheet with a metal layer) is provided and over the end cap a first repeatable unit is provided. The repeatable unit is spot welded (applying a localized heating source) to hold the unit in place on the jig. As each repeatable unit is stacked over a previous repeatable unit that unit is spot welded. The stack is provided by having ports on one side of the stack and ports on the other of the stack, and staggered resulting from arrangement of the valves so as to have a solid surface separating each of the ports in the stack (See FIG. 6). Once a stack is completed, a top cap (not shown) is provided.

The stack unit is sent to a lamination station not shown, where the stack is laminated, laminating all of the repeatable units and caps together. The end cap and top cap can be part of the packaging as well. Otherwise sets of repeatable units can be laminated or welded in pairs. Other stacking techniques for assembly are possible with or without the alignment holes.

Referring now to FIGS. 13A, 13B details of via conductors 70 to interconnect the patterned electrodes 72 on the modules as above are shown. In these figures only the electrodes 72 and the tabs are shown with the via conductors 70. The body portions are not shown for ease in understanding the via conductor structure. The via conductors are castellated structures, i.e., with relatively wide areas contacting electrode tabs 75 and relatively narrow areas through holes (not explicitly shown but see FIGS. 5A, 5B) in the electrodes 72. This arrangement is provided by having the holes in the body portions larger than the holes through the electrode portions. This can be accomplished during the patterning stages of the body and the electrodes respectively. The via conductors 70 are formed by introduction of the conductive inks mentioned above into the holes.

Figure 14A:
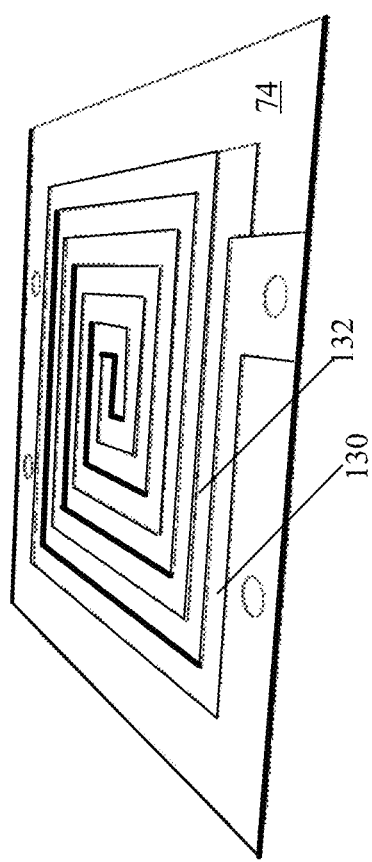
FIGS. 14A-14B are views depicting one technique to affect mechanical properties of the membranes.

Referring now to FIG. 14A, the sensitivity of the membranes 74 to pressure is effected by the choice of material (e.g., modulus of elasticity) and treatment of the material. In some applications it would also be useful to affect the properties of the membrane 74 by modifying the physical features of the membrane 74. For example, various patterns (such as two-dimension spiral or rectangular spiral a helix, etc.) of the electrodes can be machined into the membranes 74 in order to make the membranes more flexible (in comparison to the pattern of FIG. 5B where the electrode 72 covers the substantial portion of the membrane 74), as shown in FIG. 14A. In selective regions, the material of the electrode is machined away (laser machining) to provide a meandered, rectangular spiral patterned electrode 130, as shown. In some implementations, the material of the membrane 74 can also be machined to thin the membrane 74 in those regions leaving a channel 132 in the membrane 74, as shown in FIG. 14A.

Figure 14B:
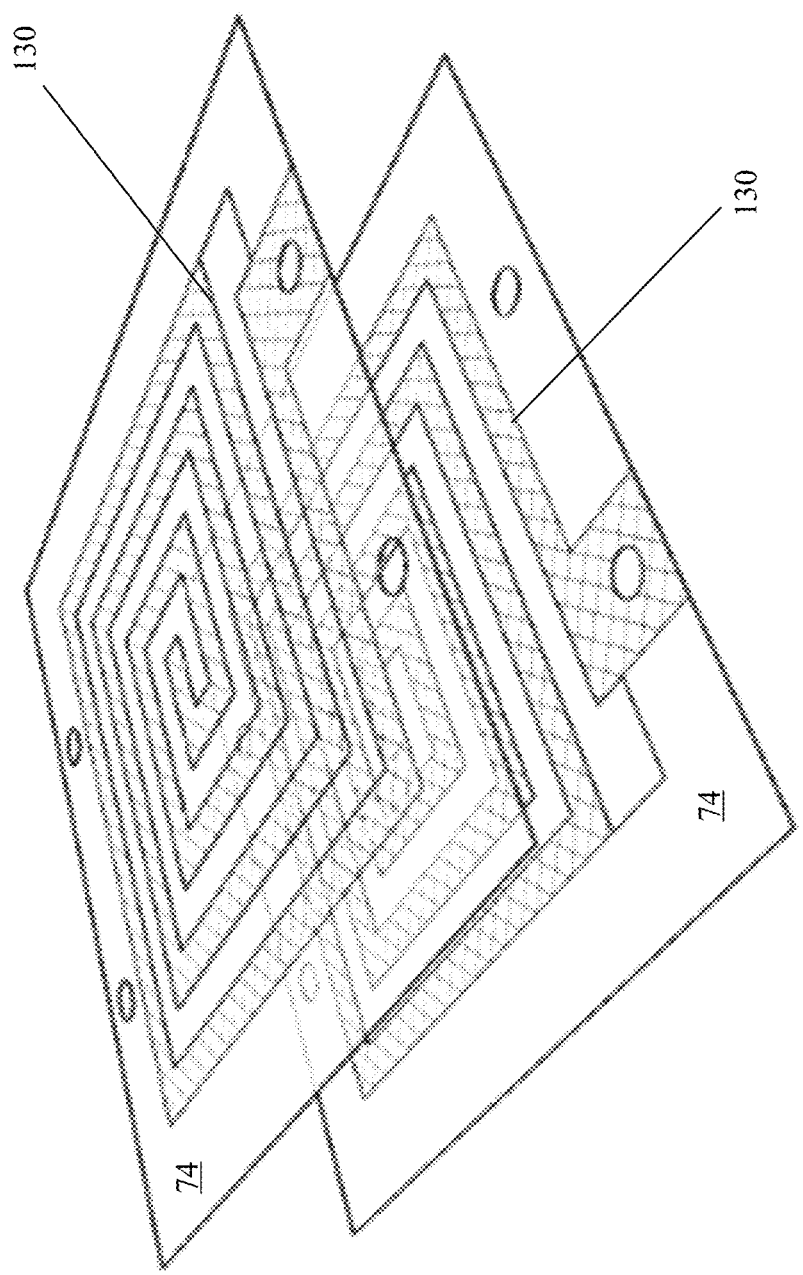

Also shown in FIG. 14B are two adjacent patterned membranes 74 (the top one as in FIG. 14A) indicating that metal of the spiral patterned electrode 130 overlay each other allowing the adjacent membranes and patterned spiral patterned electrode 130 to form a capacitor. When modifying the membrane 74 it would be understood that capacitances would be different depending on the degree of metal removed and those differences would be taken into consideration.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein. Other embodiments are within the scope of the following claims. For instance in some implementations it may be more desirable to machine the backside of the membrane.

What is claimed is:

1. A micro pressure sensor comprises:
   a body having a first pair of opposing walls and a second pair of opposing walls that are orthogonal to the first pair of opposing walls that define a single chamber, with the second pair of walls being a solid portion without any opening in the body;
   a plurality of membranes each having a surface and a single corresponding electrode layer disposed exclusively over the surface thereof, the plurality of membranes disposed in the single chamber, anchored between the first pair of opposing walls of the body to provide plural compartments within the single chamber, with changes in distance separating adjacent membranes of the plurality of membranes cause changes in capacitance between the corresponding electrode layers on each of the surfaces of the adjacent membranes;
   a first set of ports coupled to a first plurality of the plural compartments, the first set of ports disposed in corresponding portions of a first one of the first pair of opposing walls of the body, with a second one of the first pair of opposing walls of the body being a solid portion without any opening in the body; and
   a second set of ports for fluid access, the second set of ports disposed in an alternating relationship with the first set of ports, and with the second set of ports coupled to a second different plurality of the plural compartments, the second set of ports disposed in corresponding portions of the second one of the first pair of opposing walls of the body, with the first one of the first pair of walls of the body being a solid portion without any opening in the body.

2. The micro pressure sensor of claim 1 further comprising:
   a pair of end caps connected to the body to confine the single chamber.

3. The micro pressure sensor of claim 2 wherein the first set of ports are inlets and are configured to be coupled to a fluid source at a source pressure and the second set of ports are outlets and are configured to be coupled to a reference pressure, and each end cap of the pair of end caps being solid without any opening.

4. The micro pressure sensor of claim 1 wherein a first set of the electrodes on the plurality membranes are electrically connected together, and a second, different set of the electrodes on the plurality membranes are electrically connected together, and with the second set of electrodes being electrically isolated from the first set of electrodes.

5. The micro pressure sensor of claim 1 wherein each port of the first set of ports and each port in the second set of ports are staggered with respect to a preceding one of the respective first set of ports and second set of ports.

6. The micro pressure sensor of claim 1 further comprising:
   a capacitance measurement circuit that is electrically coupled to the electrode layers on the membranes.

7. The micro pressure sensor of claim 6 further comprising:
   a controller that is fed from the capacitance measurement circuit and that converts measured capacitance into a pressure.

8. The micro pressure sensor of claim 1 wherein the micro pressure sensor is configured to be driven by a fluid flow at a pressure, with the fluid directed into the first set of ports that are inlets causing the plural membranes disposed in the single chamber to flex according to pressure differences between the fluid flow pressure and a reference pressure applied to the second set of ports that are outlets.

9. The micro pressure sensor of claim 1 wherein a fluid flow at a pressure out of the first set of ports causes a first one of the plural compartments coupled to one of the first ports to compress, and causes at least one compartment adjacent the one of the plural compartments to expand substantially simultaneously for an under-pressure mode where the fluid flow pressure is less than a reference pressure.

10. The micro pressure sensor of claim 1 wherein a fluid flow at a pressure into the first set of ports causes a first one of the plural compartments coupled to the one of the first ports to expand, and causes at least one compartment adjacent one of the plural compartments to compress substantially simultaneously for an overpressure mode where the fluid flow pressure is greater than a reference pressure.

11. A micro pressure sensor comprising:
    a first micro pressure sensor module comprising:
    a first body defining a first compartment and having a single first port defined in a wall of the first body;
    a first membrane attached to a surface of the first body; and
    a single first electrically conductive electrode disposed exclusively over a single major surface of the first membrane;
    a second micro pressure sensor module arranged in a stack with the first micro pressure sensor module, the second micro pressure sensor module, comprising:
    a second body defining a second compartment and having a single second port defined in a wall of the second body, which wall opposes the wall having the single first port;
    a second membrane attached to a surface of the second body; and
    a single second electrically conductive electrode disposed exclusively on a single major surface of the second membrane, and with the second membrane in combination with the first membrane and the first body enclosing the first compartment and with changes in distance separating adjacent membranes of the plurality of membranes cause changes in capacitance between the corresponding electrode layers on each of the surfaces of the adjacent membranes.

12. The micro pressure sensor of claim 11 further comprising:
    a third micro pressure sensor module arranged in the stack with the first micro pressure sensor module and the second micro pressure sensor module, the third micro pressure sensor module comprising:
    a third body defining a third compartment and having a third port defined a wall of the third body;
    a third membrane attached to surfaces of the third body; and
    a single third electrically conductive electrode disposed only on a single major surface of the third membrane, and with the third membrane in combination with the second membrane and the second body enclosing the second compartment.

13. The micro pressure sensor of claim 12 wherein the first and third ports are source ports that are fed by a fluid at a source pressure and the second port is a reference port fed by a fluid at a reference pressure.

14. The micro pressure sensor of claim 11 wherein the first port is on a first wall of the first body and remaining walls of the first body are solid walls without any opening.

15. The micro pressure sensor of claim 11 wherein the second port is on a first wall of the second body and remaining walls of the second body are solid walls without any opening.

16. The micro pressure sensor of claim 11 wherein the micro pressure sensor is coupled to a capacitance measurement circuit.

17. The micro pressure sensor of claim 11 wherein the first and second membranes and corresponding electrodes are patterned to affect the flexibility of the first and second membranes.

18. The micro pressure sensor of claim 17 wherein patterns to affect the flexibility of the first and second membranes include a channel in the membrane material and a meandered conductor as the electrode.

19. A micro pressure sensor comprises:
a body having a plurality of walls that define a single chamber;
a plurality of membranes each having a surface and a single correspond electrode layer disposed exclusively over the surface thereof, the plurality of membranes disposed in the single chamber and anchored between two of the plurality of walls of the body forming plural compartments within the single chamber, with changes in distance separating adjacent membranes of the plurality of membranes cause changes in capacitance between the corresponding electrode layers on each of the surfaces of the adjacent membranes;
a set of inlets coupled to a first set of the plural compartments, the set of inlets disposed in corresponding portions of a first one of the plurality of walls of the body, with remaining walls of the plurality of walls of the body being a solid portion without any opening in the body; and a set of outlets coupled to a second different set of the plural compartments, the set of outlets disposed in corresponding portions of another one of the plurality of walls of the body, with the first one of the plurality of walls of the body and the remaining walls, excluding the another one of the walls, of the plurality of walls of the body being a solid portion without any opening in the body.

* * * * *